US012596215B2

(12) United States Patent
Yamada et al.

(10) Patent No.: US 12,596,215 B2
(45) Date of Patent: Apr. 7, 2026

(54) VIEWING ANGLE CONTROL SYSTEM AND IMAGE DISPLAY DEVICE

(71) Applicant: FUJIFILM Corporation, Tokyo (JP)

(72) Inventors: Naoyoshi Yamada, Kanagawa (JP); Fumitake Mitobe, Kanagawa (JP); Shinya Watanabe, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 666 days.

(21) Appl. No.: 17/901,462

(22) Filed: Sep. 1, 2022

(65) Prior Publication Data

US 2023/0037017 A1 Feb. 2, 2023

Related U.S. Application Data

(63) Continuation of application No. PCT/JP2021/007967, filed on Mar. 2, 2021.

(30) Foreign Application Priority Data

Mar. 5, 2020 (JP) ................................ 2020-037907
Oct. 21, 2020 (JP) ................................ 2020-176586
Feb. 17, 2021 (JP) ................................ 2021-023249

(51) Int. Cl.
*G02B 27/28* (2006.01)
*G02B 5/30* (2006.01)
*H10K 59/80* (2023.01)

(52) U.S. Cl.
CPC ......... *G02B 5/3041* (2013.01); *G02B 5/3083* (2013.01); *G02B 27/281* (2013.01); *H10K 59/8791* (2023.02)

(58) Field of Classification Search
CPC .. G02B 5/3041; G02B 5/3083; G02B 27/281; H01K 59/8791

(Continued)

(56) References Cited

U.S. PATENT DOCUMENTS

2009/0153783 A1 6/2009 Umemoto
2009/0251650 A1* 10/2009 Fukagawa ......... G02F 1/133634 349/119

(Continued)

FOREIGN PATENT DOCUMENTS

JP 2008-165201 A 7/2008
JP 2009-145776 A 7/2009

(Continued)

OTHER PUBLICATIONS

International Search Report issued in PCT/JP2021/007967 on May 25, 2021.

(Continued)

*Primary Examiner* — Bumsuk Won
*Assistant Examiner* — Grant A Gagnon
(74) *Attorney, Agent, or Firm* — Edwards Neils LLC; Jean C. Edwards, Esq.

(57) ABSTRACT

A viewing angle control system is used in combination with a high-definition image display device and sufficiently shields light emitted in a direction oblique to a normal direction of a film. The viewing angle control system includes at least a first polarizer, a retardation layer, and a second polarizer in this order, where an absorption axis of the first polarizer forms an angle of 45° or greater with respect to a surface, the retardation layer satisfies Expression (1): an in-plane retardation Re of the retardation layer satisfies an expression of 80 nm<Re<250 nm, and Expression (2): in a case of Nz=Rth/Re+0.5, an expression of 1.5<Nz<6 or −5<Nz<−0.5 is satisfied, where Rth represents a retardation of the retardation layer in a thickness direction, and the second polarizer has an absorption axis in an in-plane direction.

20 Claims, 7 Drawing Sheets

(58) Field of Classification Search
USPC .......................................................... 359/489
See application file for complete search history.

(56) References Cited

U.S. PATENT DOCUMENTS

| | | | |
|---|---|---|---|
| 2010/0092784 | A1 | 4/2010 | Kamada et al. |
| 2010/0157208 | A1 | 6/2010 | Hanne |
| 2010/0271721 | A1 | 10/2010 | Gaides et al. |
| 2015/0378068 | A1 | 12/2015 | Hatanaka |
| 2019/0064557 | A1 | 2/2019 | Yanai |
| 2020/0096803 | A1 | 3/2020 | Saitoh et al. |
| 2021/0088825 | A1 | 3/2021 | Muto |
| 2021/0215970 | A1 | 7/2021 | Chang et al. |

FOREIGN PATENT DOCUMENTS

| | | | |
|---|---|---|---|
| JP | 4902516 | B2 | 3/2012 |
| JP | 2012-103719 | A | 5/2012 |
| JP | 2016-027387 | A | 2/2016 |
| JP | 6345732 | B2 | 6/2018 |
| WO | 2017/199656 | A1 | 11/2017 |
| WO | 2018/221413 | A1 | 12/2018 |
| WO | 2019/235355 | A1 | 12/2019 |
| WO | 2019/235792 | A1 | 12/2019 |

OTHER PUBLICATIONS

Written Opinion issued in PCT/JP2021/007967 on May 25, 2021.
International Preliminary Report on Patentability completed by WIPO on Sep. 6, 2022 in connection with International Patent Application No. PCT/JP2021/007967.

* cited by examiner

VIEWING ANGLE CONTROL SYSTEM AND IMAGE DISPLAY DEVICE

CROSS-REFERENCE TO RELATED APPLICATIONS

This application is a Continuation of PCT International Application No. PCT/JP2021/007967 filed on Mar. 2, 2021, which was published under PCT Article 21(2) in Japanese, and which claims priority under 35 U.S.C. § 119(a) to Japanese Patent Application No. 2020-037907 filed on Mar. 5, 2020, Japanese Patent Application No. 2020-176586 filed on Oct. 21, 2020, and Japanese Patent Application No. 2021-023249 filed on Feb. 17, 2021. The above applications-is are hereby expressly incorporated by reference, in their entirety, into the present application.

BACKGROUND OF THE INVENTION

1. Field of the Invention

The present invention relates to a viewing angle control polarizing plate including a polarizer having an absorption axis at an angle of 45° or greater with respect to an in-plane direction and a retardation layer having an in-plane retardation Re of greater than 60 nm, and a viewing angle control system.

2. Description of the Related Art

Image display devices such as liquid crystal display devices and organic EL display devices are frequently used as displays for smartphones, notebook computers, and the like. In recent years, since these devices have been thinner and lighter and are thus easily carried, the devices are used in public places, for example, transportation facilities such as trains and aircraft, libraries, and restaurants in many cases. Therefore, due to the need to protect personal information, confidential information, and the like, there is a demand for a technique for preventing the display contents of image display devices from being peeped by others.

Further, in recent years, the image display devices have also been used as in-vehicle displays installed in automobiles. As a result of an increase in size of in-vehicle displays, there is a problem that light emitted from the displays is reflected on the windshield, side glass, or the like and interferes with driving, and thus a technique for preventing reflected glare has been required.

In order to solve such a problem, a viewing angle control system that limits the viewing angle range of light emitted from an image display device and prevents the light from being emitted in a specific direction has been suggested.

For example, JP6345732B discloses a viewing angle control system in which light transmission regions and light absorption regions are alternately arranged in the plane of a film to limit emission of light in an oblique direction with respect to a normal direction of the film. Such a viewing angle control system is usually referred to as a louver film.

Further, JP4902516B discloses a viewing angle control system consisting of a laminate that includes a polarizer having an absorption axis in an in-plane direction of a film and a polarizer having an absorption axis in a range of 0° to 45° in a normal direction of the film, in which the emission angle of light is limited by decreasing the transmittance in an oblique direction with respect to a normal direction of the film.

SUMMARY OF THE INVENTION

The louver film described in JP6345732B can sufficiently shield light emitted in the oblique direction with respect to the normal direction of the film, and thus has been commonly used for the purpose of preventing peeping into a notebook computer or the like and preventing reflected glare on the windshield, side glass, or the like of an in-vehicle display. However, since the light transmission regions and the light absorption regions are alternately laminated at a pitch of approximately several tens of μm in the louver film, the periodic structure interferes with the pixels of the image display device, and thus a stripe pattern referred to as moire is generated in some cases. Particularly, in recent years, since image display devices have high-definition pixels, the problem of moire has been more significant.

Further, since the louver film typically has a base material layer consisting of a polycarbonate film or the like and has a thickness of 300 μm or greater, the louver film is not easily bent. In recent years, some image display devices used as in-vehicle displays or the like have a curved display surface, and thus the louver film is difficult to apply to such image display devices.

The viewing angle control system described in JP4902516B does not have a periodic structure that interferes with the pixels of the image display device and thus can be used without the occurrence of moire. Further, in the viewing angle control system described in JP4902516B, the polarizer has a thickness of several to several tens of μm, and thus the entire thickness can be set to be small even in a case of including other base material layers. Therefore, the viewing angle control system can easily be made to follow the curved surface.

However, according to the examination on the viewing angle control system described in JP4902516B conducted by the present inventors, since the transmittance in a direction oblique to the normal direction of the film cannot be sufficiently reduced and light emitted obliquely is insufficiently shielded, the light shielding performance is not enough for the viewing angle control system to be used for the purpose of preventing peeping into a notebook computer or the like and preventing reflected glare on the windshield, side glass, or the like of an in-vehicle display.

The present invention has been made in view of the above-described circumstances, and an object thereof is to provide a viewing angle control system that is capable of easily following a curved surface without occurrence of moire even in a case of being used in a combination with a high-definition image display device and is capable of sufficiently shielding light emitted in a direction oblique to a normal direction of a film, and an image display device.

As a result of the intensive examination conducted by the present inventors, it was found that the above-described object can be achieved by employing the following configurations.

<1> A viewing angle control system comprising at least: a first polarizer; a retardation layer; and a second polarizer in this order, in which an absorption axis of the first polarizer forms an angle of 45° or greater with respect to a surface, the retardation layer satisfies Expression (1) and Expression (2), and the second polarizer has an absorption axis in an in-plane direction, an in-plane retardation Re of the retardation layer satisfies an expression of $80\text{ nm}<Re<250\text{ nm}$, and Expression (1):

in a case of $Nz=Rth/Re+0.5$, an expression of $1.5<Nz<6$ or $-5<Nz<-0.5$ is satisfied, where $Rth$ represents a retardation of the retardation layer in a thickness direction. Expression (2):

<2> The viewing angle control system according to <1>, in which the absorption axis of the first polarizer is perpendicular to the surface of the viewing angle control system.

<3> The viewing angle control system according to <1> or <2>, in which the retardation layer is a B-plate having an Nz coefficient of greater than 1.5.

<4> The viewing angle control system according to <1> or <2>, in which the retardation layer is a B-plate having an Nz coefficient of less than −0.5.

<5> The viewing angle control system according to <1> or <2>, in which the retardation layer includes at least a positive A-plate and a positive C-plate, and the positive A-plate is provided on a side of the first polarizer.

<6> The viewing angle control system according to <1> or <2>, in which the retardation layer includes at least a negative A-plate and a negative C-plate, and the negative A-plate is provided on a side of the first polarizer.

<7> The viewing angle control system according to <1> or <2>, in which the retardation layer includes at least a B-plate and a positive C-plate, and the B-plate is provided on a side of the first polarizer.

<8> The viewing angle control system according to <1> or <2>, in which the retardation layer includes at least a B-plate and a negative C-plate, and the B-plate is provided on a side of the first polarizer.

<9> The viewing angle control system according to <1> or <2>, in which the retardation layer is a B-plate having an Nz coefficient of greater than 1.5, and an angle between a slow axis of the B-plate and the absorption axis of the second polarizer is 10° or less.

<10> The viewing angle control system according to <1> or <2>, in which the retardation layer is a B-plate having an Nz coefficient of less than −0.5, and an angle between a slow axis of the B-plate and the absorption axis of the second polarizer is 80° or greater and 100° or less.

<11> The viewing angle control system according to <1> or <2>, in which the retardation layer includes at least a positive A-plate and a positive C-plate, the positive A-plate is provided on a side of the first polarizer, and an angle between a slow axis of the positive A-plate and the absorption axis of the second polarizer is 80° or greater and 100° or less.

<12> The viewing angle control system according to <1> or <2>, in which the retardation layer includes at least a negative A-plate and a negative C-plate, the negative A-plate is provided on a side of the first polarizer, and an angle between a slow axis of the negative A-plate and the absorption axis of the second polarizer is 10° or less.

<13> The viewing angle control system according to <1> or <2>, in which the retardation layer includes at least a B-plate and a positive C-plate, the B-plate is provided on a side of the first polarizer, and an angle between a slow axis of the B-plate and the absorption axis of the second polarizer is 80° or greater and 100° or less.

<14> The viewing angle control system according to <1> or <2>, in which the retardation layer includes at least a B-plate and a negative C-plate, the B-plate is provided on a side of the first polarizer, and an angle between a slow axis of the B-plate and the absorption axis of the second polarizer is 10° or less.

<15> An image display device comprising: the viewing angle control system according to any one of <1> to <14>.

According to the present invention, it is possible to provide a viewing angle control system that is capable of easily following a curved surface without occurrence of moire even in a case of being used in a combination with a high-definition image display device and is capable of sufficiently shielding light emitted in a direction oblique to a normal direction of a film, and an image display device.

DESCRIPTION OF THE PREFERRED EMBODIMENTS

Figure 1:
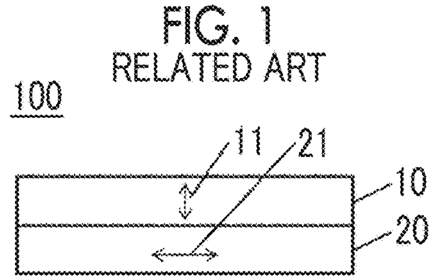
FIG. 1 is a schematic view illustrating a viewing angle control system of the related art.

Hereinafter, the present invention will be described in detail with reference to the accompanying drawings. The description of configuration requirements below may be made based on typical embodiments or specific examples, but the present invention is not limited to such embodiments.

Further, in the present specification, a numerical range shown using "to" indicates a range including numerical values described before and after "to" as a lower limit and an upper limit.

Further, in the present specification, the symbol "≈" is also used not only in a case where two elements are completely the same as each other but also in a case where two elements are substantially the same as each other.

In the present specification, the polarizing plate denotes a polarizer having at least one surface provided with a protective layer or a functional layer, and the polarizer and the polarizing plate are distinguished from each other.

In the present specification, the terms parallel and vertical do not mean parallel and vertical in a strict sense, but mean a range of parallel f 5° and a range of vertical f 5°.

In the present specification, the azimuthal angle denotes an angle formed by the azimuth of an absorption axis of a second polarizer in a plane of a film, unless otherwise specified. Further, the polar angle denotes an angle formed with the normal direction of the film.

In the present invention, refractive indices nx and ny are refractive indices in the in-plane direction of an optical member, and typically, nx represents a refractive index of a slow axis azimuth and ny represents a refractive index of a fast axis azimuth (that is, the azimuth perpendicular to the slow axis). Further, nz represents a refractive index in the thickness direction. In the present invention, the refractive indices nx, ny, and nz are measured with an Abbe refractometer (NAR-4T, manufactured by Atago Co., Ltd.) using a sodium lamp (λ=589 nm) as a light source. In a case of measuring the wavelength dependence, a multi-wavelength Abbe refractometer DR-M2 (manufactured by Atago Co., Ltd.) can be used in combination with an interference filter. In addition, values from Polymer Handbook (John Wiley & Sons, Inc.) and catalogs of various optical films can also be used.

In the present specification, Re (λ) and Rth (λ) respectively represent an in-plane retardation at a wavelength λ and a retardation at a wavelength λ in a thickness direction, and refractive indices nx, ny, and nz are represented by Equation (1) and Equation (2) using a film thickness d (m).

$$Re(\lambda)=(nx-ny)\times d\times 1000\ (nm) \qquad \text{Equation (1):}$$

$$Rth(\lambda)=((nx+ny)/2-nz)\times d\times 1000\ (nm) \qquad \text{Equation (2):}$$

The wavelength λ is set to 550 nm unless otherwise specified.

The slow axis azimuth, Re (λ), and Rth (λ) can be measured using, for example, AxoScan OPMF-1 (manufactured by Opto Science Inc.).

In the present specification, the Nz coefficient is defined by Equation (3).

$$Nz=(nx-nz)/(nx-ny) \qquad \text{Equation (3):}$$

Further, the Nz coefficient can also be acquired by Equation (4) based on the definition of Re and Rth.

$$Nz=0.5+Rth/Re \qquad \text{Equation (4):}$$

The Nz coefficient is set to a value at a wavelength of 550 nm unless otherwise specified.

(Viewing Angle Control System of Related Art)

First, the mechanism for controlling the viewing angle of the viewing angle control system of the related art described in JP4902516B will be described.

Figure 2:
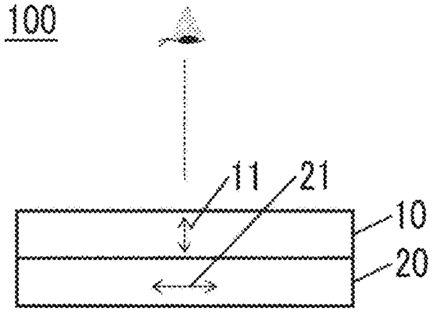
FIG. 2 is a schematic view illustrating a viewing angle control system of the related art.

FIG. 1 is a cross-sectional view illustrating a viewing angle control system 100 in which a first polarizer 10 having an absorption axis 11 in the normal direction of the film and a second polarizer 20 having an absorption axis 21 in the in-plane direction of the film are laminated. The absorption axis of the first polarizer 10 forms an angle of 90° with respect to the surface of the viewing angle control system 100 (first polarizer 10). As illustrated in FIG. 2, the absorption axis 11 is horizontal to a visual line direction in a case where the viewing angle control system 100 is visually recognized from the front (that is, in the normal direction of the film), and thus the first polarizer 10 does not absorb light traveling in the visual line direction. Meanwhile, the absorption axis 21 absorbs a linearly polarized light component parallel to the absorption axis 21 and transmits a linearly polarized light component orthogonal to the absorption axis 21. Therefore, the viewing angle control system 100 transmits light.

Figure 3:
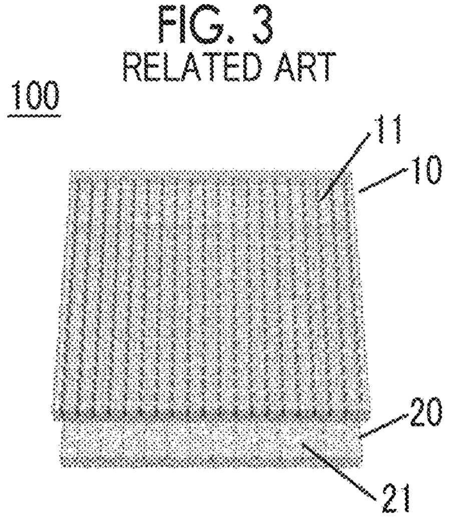
FIG. 3 is a schematic view illustrating a viewing angle control system of the related art.

FIG. 3 is a view illustrating a state in which the viewing angle control system 100 is visually recognized in an azimuth (azimuthal angle of 0°) of the absorption axis 21 in the plane of the film from an angle oblique to the normal direction of the film. However, in FIG. 3, the absorption axis 11 and the absorption axis 21 are expressed as columns and considered to be visually recognized in a front direction of the paper surface. Here, the absorption axis 11 and the absorption axis 21 are apparently parallel to each other. Among the light incident in the viewing direction, a linearly polarized light component parallel to the absorption axis 11 and the absorption axis 21 is absorbed, and a linearly polarized light component orthogonal to the absorption axis 11 and the absorption axis 21 is transmitted. Therefore, light traveling in the visual line direction is not absorbed, and the viewing angle control system 100 transmits the light.

Figure 4:
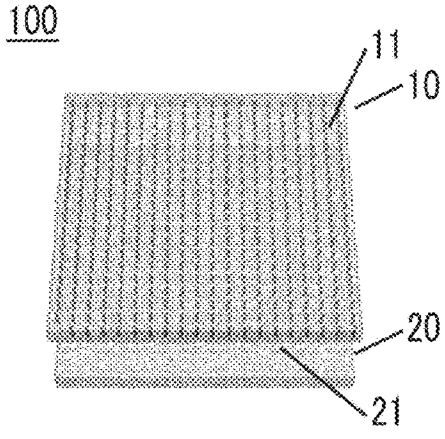
FIG. 4 is a schematic view illustrating a viewing angle control system of the related art.

Meanwhile, as illustrated in FIG. 4, in a case where the viewing angle control system 100 is visually recognized in an azimuth (azimuthal angle of 90°) perpendicular to the absorption axis 21 in the plane of the film from an angle oblique to the normal direction of the film, the absorption axis 11 and the absorption axis 21 are perpendicular to each other. In the light incident in the viewing direction, first, a linearly polarized light component parallel to the absorption axis 11 is absorbed by the first polarizer 10, and a linearly polarized light component orthogonal to the absorption axis 11 is transmitted. Next, the linearly polarized light component transmitted through the first polarizer 10 is incident on the second polarizer 20, but is absorbed by the second polarizer 20 because the linearly polarized light is parallel to the absorption axis 21. Therefore, in this case, the light traveling in the visual line direction is absorbed, and the viewing angle control system 100 shields the light.

With the above-described mechanism, the viewing angle control system 100 can shield light traveling obliquely in an azimuth (azimuthal angle 90°) perpendicular to the absorption axis 21 in the plane of the film. Further, JP4902516B describes that in a case where a medium is present between the first polarizer 10 and the second polarizer 20, it is preferable that the medium does not have a retardation in order to prevent the polarization state from being substantially converted. Further, JP4902516B also describes that even in a case where the medium has a retardation, it is preferable that the in-plane retardation Re of the medium and the retardation Rth in the thickness direction are small and that the Nz coefficient of the medium is close to 1.

However, as a result of the intensive examination conducted by the present inventors, it was found that the viewing angle control system 100 cannot sufficiently shield light traveling obliquely in an azimuth that is not horizontal or perpendicular to the absorption axis 21 in the plane of the film.

Figure 5A:
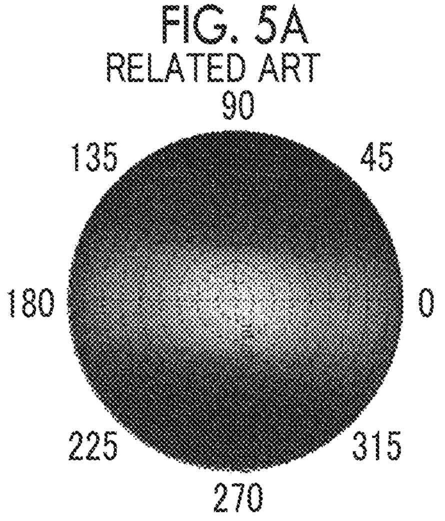
FIG. 5A shows a viewing angle characteristic of a viewing angle control system of the related art.
Figure 5B:
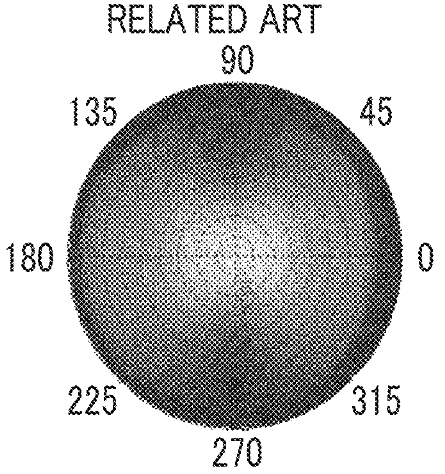
FIG. 5B shows a viewing angle characteristic of a viewing angle control system of the related art.

FIG. 5A is a contour view in which the viewing angle characteristics (the azimuthal angle of brightness and the polar angle dependence) in a case where a louver film commonly used as a viewing angle control system is provided in a liquid crystal display device are measured using a viewing angle characteristic evaluation device EZContrast (manufactured by ELDIM). Further, FIG. 5B is a contour view in which the viewing angle characteristics in a case where the viewing angle control system 100 of the related art is provided in the liquid crystal display device are measured. As is evident in FIGS. 5A and 5B, the viewing angle control system 100 has a greater value of brightness at a high polar angle, for example, at an azimuthal angle of 45° as compared with a louver film, and as a result, sufficient light shielding performance can be exhibited only in an extremely limited angle range in the vicinity of an azimuthal angle of 90° and in the vicinity of an azimuthal angle of 270°.

The present inventors have considered the causes of the above-described problems of the viewing angle control system 100 of the related art as follows.

Figure 6:
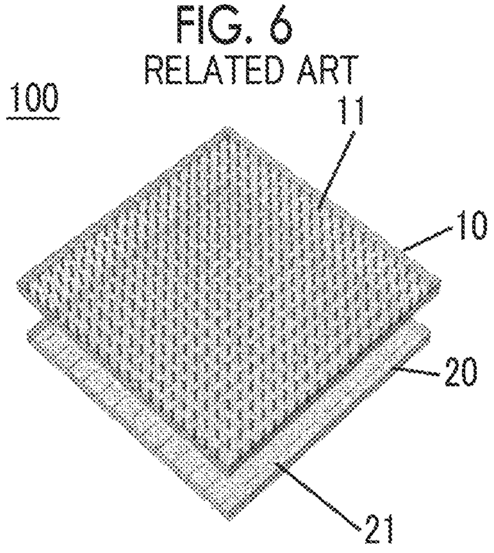
FIG. 6 is a schematic view illustrating a viewing angle control system of the related art.

FIG. 6 is a view in which the viewing angle control system 100 is visually recognized at an azimuthal angle of 45° and at a polar angle of 60°. Here, the absorption axis 11 and the absorption axis 21 are apparently not perpendicular or parallel to each other. In this case, in the light incident in the viewing direction, first, a linearly polarized light component parallel to the absorption axis 11 is absorbed by the first polarizer 10, and a linearly polarized light component orthogonal to the absorption axis 11 is transmitted. Next, the linearly polarized light component transmitted through the first polarizer 10 is incident on the second polarizer 20, but is not completely parallel to the absorption axis 21, and thus a part of the component is absorbed by the second polarizer 20 and the remaining component is transmitted through the second polarizer 20. Therefore, the light traveling in the visual line direction is not completely absorbed and a part of the light is transmitted. Therefore, the light shielding performance in this direction is insufficient.

(Viewing Angle Control Polarizing Plate and Viewing Angle Control System According to Embodiment of Present Invention)

Next, in the viewing angle control polarizing plate and the viewing angle control system according to the embodiment of the present invention, a mechanism for expanding the light shielding angle range will be described.

Figure 7:
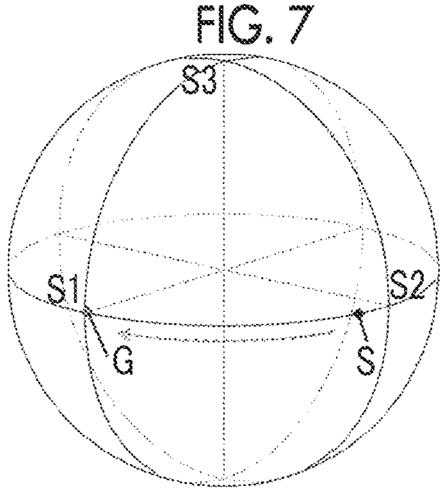
FIG. 7 is a conceptual view illustrating an effect of a viewing angle control system of the present invention.

As a result of further examination conducted by the present inventors, it was found that the vertical deviation between the absorption axis 11 and the absorption axis 21 in FIG. 6 can be compensated by using a retardation layer. As an example, FIG. 7 is a Poincare sphere showing the polarization state of transmitted light in a case where the viewing angle control system 100 is visually recognized at an azimuthal angle of 45° and a polar angle of 60° at the time of incidence of light on the viewing angle control system 100 from a side of the second polarizer 20. In FIG. 7, the point S represents a polarization azimuth of light immediately after being transmitted through the second polarizer 20. Further, the point G represents an absorption axis azimuth of the first polarizer 10. The compensation using the retardation layer denotes conversion of the polarization state of the point S to the polarization state of the point G (conceptually indicated by the dashed arrow in FIG. 7).

Figure 8:
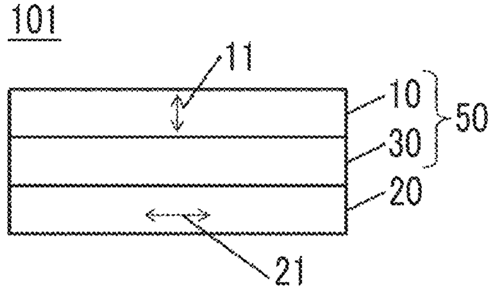
FIG. 8 is a schematic view illustrating the viewing angle control system of the present invention.

FIG. 8 is a schematic view illustrating an example of the viewing angle control system according to the embodiment of the present invention.

A viewing angle control system 101 illustrated in FIG. 8 includes a viewing angle control polarizing plate 50 having the first polarizer 10 and a retardation layer 30, and the second polarizer 20.

The viewing angle control polarizing plate 50 is formed by laminating at least the first polarizer 10 having the absorption axis 11 in the normal direction of the film and the retardation layer 30. In the illustrated example, the absorption axis 11 of the first polarizer 10 forms an angle of 90° with respect to the surface of the viewing angle control system 100 (first polarizer 10). The retardation layer 30 may be a single-layer optical member or may be formed by laminating a plurality of layers (optically anisotropic layers). Further, the in-plane retardation Re of the retardation layer 30 shows the following states depending on the configuration.

(A) In a case where the retardation layer 30 consists of one optically anisotropic layer having a slow axis in the plane or in a case where one optically anisotropic layer having a slow axis in the plane and an optically anisotropic layer having a slow axis in the thickness direction are laminated (in a case where a plurality of layers are laminated, Re and Rth are set to be the total values of these layers), Expression (1): $80\ nm<Re<250\ nm$ is satisfied. Further, in a case where the retardation of the retardation layer 30 in the thickness direction is defined as Rth, Expression (2): $1.5<Nz<6$ or $-5<Nz<-0.5$ is satisfied in a case of $Nz=Rth/Re+0.5$.

(B) In a case where the retardation layer 30 consists of two or more layers of optically anisotropic layers having a slow axis in the plane, and the angle between the slow axes of at least two layers is in a range of 80° to 110°, each layer satisfies Expressions (1) and (2).

(C) In cases other than the above-described cases (A) and (B), Re and Rth are set to be the total values of each layer and satisfy Expressions (1) and (2).

The viewing angle control system 101 according to the embodiment of the present invention can be constructed by laminating the viewing angle control polarizing plate 50 on the second polarizer 20 having the absorption axis 21 in the in-plane direction of the film. That is, the viewing angle control system 101 according to the embodiment of the present invention has at least the retardation layer 30 between the first polarizer 10 and the second polarizer 20.

In a case where the viewing angle control system 101 is visually recognized obliquely in an azimuth that is not horizontal or perpendicular to the absorption axis 21 in the plane of the film, the vertical deviation between the absorption axis 11 and the absorption axis 21 is compensated by appropriately adjusting the optical characteristics of the retardation layer 30.

In a case where the viewing angle control system 101 is visually recognized from the front, the absorption axis 11 is horizontal to the visual line direction, and the first polarizer 10 transmits light regardless of the polarization state of incident light. Therefore, the visibility from the front is not limited by the optical characteristics of the retardation layer 30. Therefore, the degree of freedom in designing the Re, Rth, and the optical axis of the retardation layer 30 increases.

(One Example of Viewing Angle Control System According to Embodiment of Present Invention)

Figure 9A:
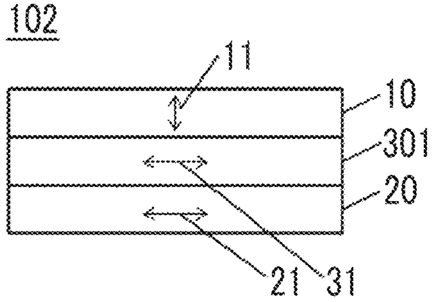
FIG. 9A is a schematic view illustrating an example of the viewing angle control system of the present invention.

FIG. 9A is a schematic view illustrating an example of the viewing angle control system according to the embodiment of the present invention. A viewing angle control system 102 has a retardation layer 301 consisting of a B-plate between the first polarizer 10 and the second polarizer 20.

Here, the B-plate denotes a biaxial optical member in which the refractive indices nx, ny, and nz are values different from each other.

The Re of the retardation layer 301 is preferably greater than 80 nm and less than 250 nm, more preferably 100 nm or greater and less than 250 nm, and still more preferably 100 nm or greater and 200 nm or less.

Further, the Nz coefficient of the retardation layer 301 is preferably greater than 1.5, more preferably 2.0 or greater and 10.0 or less, and still more preferably 3.0 or greater and 5.0 or less.

It is preferable that the Rth of the retardation layer 301 is set such that both the Re and the Nz coefficient are set to be in the above-described preferable ranges, and specifically, the Rth thereof is preferably greater than 60 nm.

Further, the slow axis 31 of the retardation layer 301 forms an azimuthal angle of preferably −10° or greater and 100 or less, more preferably −5° or greater and 5° or less, and most preferably 0° (that is, parallel to the absorption axis 21) in a case where the direction of the absorption axis 21 is set to 0°. That is, the angle between the slow axis 31 of the retardation layer 301, which is the B-plate, and the absorption axis 21 of the second polarizer 20 is preferably 10° or less, more preferably 5° or less, and most preferably 0°.

In a case where the optical characteristics of the retardation layer 301 are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 9B:
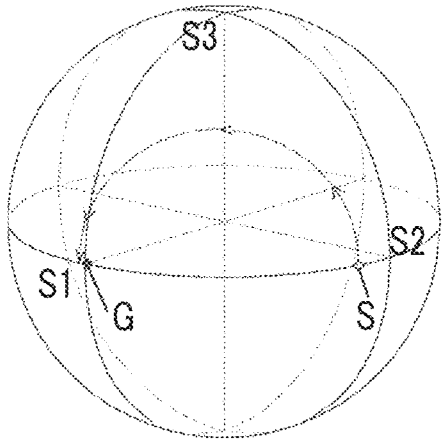
FIG. 9B is a Poincare sphere showing a change in polarization state of the viewing angle control system illustrated in FIG. 9A.

As a specific example, in a case where the Re of the retardation layer 301 is 170 nm, the Rth thereof is 510 nm, the Nz coefficient thereof is 3.5, and the azimuthal angle of the slow axis 31 is 0°, FIG. 9B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G.

(Another Example of Viewing Angle Control System According to Embodiment of Present Invention)

Figure 10A:
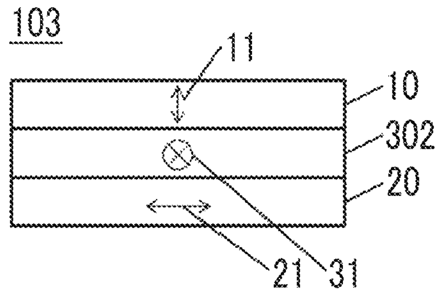
FIG. 10A is a schematic view illustrating an example of the viewing angle control system of the present invention.

FIG. 10A is a schematic view illustrating another example of the viewing angle control system according to the embodiment of the present invention. A viewing angle control system 103 has a retardation layer 302 consisting of a B-plate between the first polarizer 10 and the second polarizer 20.

The Re of the retardation layer 302 is preferably greater than 80 nm and less than 250 nm, more preferably 100 nm or greater and less than 250 nm, and still more preferably 100 nm or greater and 200 nm or less.

Further, the Nz coefficient of the retardation layer 302 is preferably greater than −0.5, more preferably −10.0 or greater and −1.0 or less, and still more preferably −3.0 or greater and −2.0 or less.

It is preferable that the Rth of the retardation layer 302 is set such that both the Re and the Nz coefficient are set to be in the above-described preferable ranges, and specifically, the Rth thereof is preferably greater than −60 nm.

Further, the slow axis 31 of the retardation layer 302 forms an azimuthal angle of preferably 80° or greater and 100° or less, more preferably 85° or greater and 95° or less, and most preferably 90° (that is, perpendicular to the absorption axis 21). That is, the angle between the slow axis 31 of the retardation layer 302, which is the B-plate, and the absorption axis 21 of the second polarizer 20 is preferably 80° or greater and 100° or less, more preferably 85° or greater and 95° or less, and most preferably 90°.

In a case where the optical characteristics of the retardation layer 302 are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 10B:
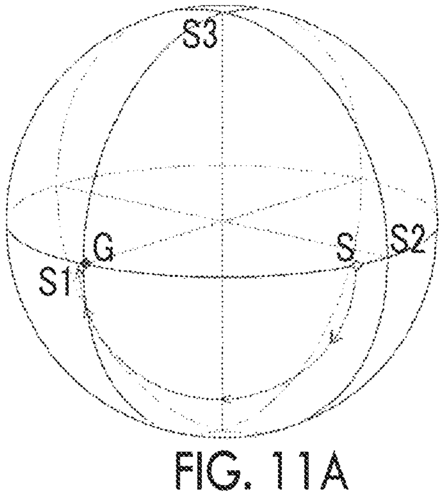
FIG. 10B is a Poincare sphere showing a change in polarization state of the viewing angle control system illustrated in FIG. 10A.

As a specific example, in a case where the Re of the retardation layer 302 is 170 nm, the Rth thereof is −510 nm, the Nz coefficient thereof is −2.5, and the azimuthal angle of the slow axis 31 is 90°, FIG. 10B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G.

(Still Another Example of Viewing Angle Control System According to Embodiment of Present Invention)

Figure 11A:
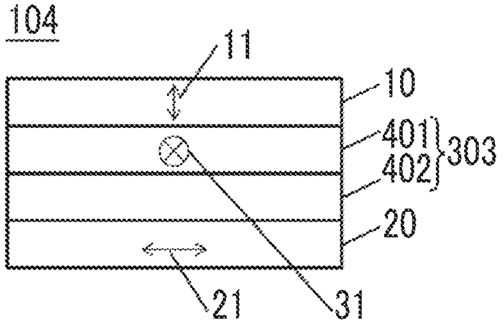
FIG. 11A is a schematic view illustrating an example of the viewing angle control system of the present invention.

FIG. 11A is a schematic view illustrating still another example of the viewing angle control system according to the embodiment of the present invention. A viewing angle control system 104 includes the first polarizer 10, a retardation layer 303 that consists of an optically anisotropic layer 401 consisting of a positive A-plate and an optically anisotropic layer 402 consisting of a positive C-plate, and the second polarizer 20 in this order. That is, the retardation layer 303 includes a positive A-plate and a positive C-plate, and the positive A-plate is provided on a side of the first polarizer 10.

Here, the positive A-plate denotes an optical member in which the refractive indices nx, ny, and nz satisfy Expression (5).

$$Nx > Ny \approx Nz \qquad \text{Expression (5):}$$

Further, the positive C-plate denotes an optical member in which the refractive indices nx, ny, and nz satisfy Expression (6).

$$nz > nx \approx ny \qquad \text{Expression (6):}$$

The Re of the retardation layer 303 (the total Re of the optically anisotropic layer 401 and the optically anisotropic layer 402) is preferably greater than 80 nm and less than 250 nm, more preferably 100 nm or greater and 200 nm or less, and still more preferably 100 nm or greater and 150 nm or less. Since the optically anisotropic layer 402, which is the positive C-plate, satisfies Re≈0, the Re of the retardation layer 303 is substantially the same as the Re of the optically anisotropic layer 401 which is the positive A-plate, and the slow axis 31 of the retardation layer 303 is substantially the same as the slow axis of the optically anisotropic layer 401 which is the positive A-plate.

Further, the slow axis 31 of the optically anisotropic layer 401 which is the positive A-plate forms an azimuthal angle of preferably 80° or greater and 100° or less, more preferably 85° or greater and 95° or less, and most preferably 90° (that is, perpendicular to the absorption axis 21). That is, the angle between the slow axis 31 of the optically anisotropic layer 401, which is the positive A-plate, and the absorption axis 21 of the second polarizer 20 is preferably 80° or greater and 100° or less, more preferably 85° or greater and 95° or less, and most preferably 90°.

The Rth of the optically anisotropic layer 402 is preferably less than −60 nm, more preferably −600 nm or greater and −100 nm or less, and still more preferably −500 nm or greater and −200 nm or less. Since the optically anisotropic layer 401 which is the positive A-plate satisfies Rth z Re/2, the Rth of the retardation layer 303 is the total Rth of the positive A-plate and the optically anisotropic layer 402 which is the positive C-plate.

In a case where the optical characteristics of the retardation layer 303 (the optically anisotropic layer 401 and the optically anisotropic layer 402) are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 11B:
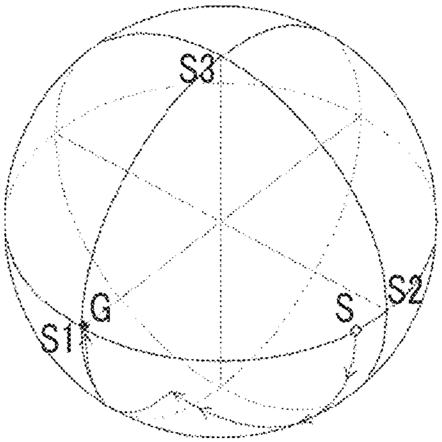
FIG. 11B is a Poincare sphere showing a change in polarization state in the viewing angle control system illustrated in FIG. 11A.

As a specific example, in a case where the Re of the retardation layer 303 is 120 nm, the azimuthal angle of the slow axis 31 is 90°, and the Rth of the retardation layer 303 is −420 nm, FIG. 11B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G. In this case, the Nz coefficient is −2.5.

(Still Another Example of Viewing Angle Control System According to Embodiment of Present Invention)

Figure 12A:
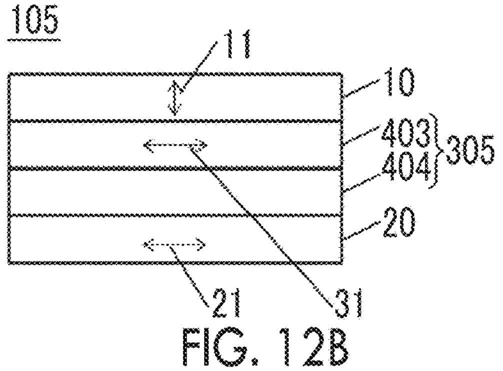
FIG. 12A is a schematic view illustrating an example of the viewing angle control system of the present invention.

FIG. 12A is a schematic view illustrating still another example of the viewing angle control system according to the embodiment of the present invention. A viewing angle control system 105 includes the first polarizer 10, a retardation layer 305 that has an optically anisotropic layer 403 consisting of a negative A-plate and an optically anisotropic layer 404 consisting of a negative C-plate, and the second polarizer 20 in this order. That is, the retardation layer 305 includes a negative A-plate and a negative C-plate, and the negative A-plate is provided on a side of the first polarizer 10.

Here, the negative A-plate denotes an optical member in which the refractive indices nx, ny, and nz satisfy Expression (7).

$$nx \approx nz > ny \qquad \text{Expression (7):}$$

Further, the negative C-plate denotes an optical member in which the refractive indices nx, ny, and nz satisfy Expression (8).

$$nx \approx ny > nz \qquad \text{Expression (8):}$$

The Re of the retardation layer 305 (the total Re of the optically anisotropic layer 403 and the optically anisotropic layer 404) is preferably greater than 80 nm and less than 250 nm, more preferably 100 nm or greater and 200 nm or less, and still more preferably 100 nm or greater and 150 nm or less. Since the optically anisotropic layer 404, which is the negative C-plate, satisfies Re≈0, the Re of the retardation layer 305 is substantially the same as the Re of the optically anisotropic layer 403 which is the negative A-plate, and the slow axis 31 of the retardation layer 305 is substantially the same as the slow axis of the optically anisotropic layer 403 which is the negative A-plate.

Further, the slow axis 31 of the optically anisotropic layer 403 which is the negative A-plate forms an azimuthal angle of preferably −10° or greater and 100 or less, more preferably −5° or greater and 5° or less, and most preferably 0° (that is, parallel to the absorption axis 21). That is, the angle between the slow axis 31 of the optically anisotropic layer 403, which is the negative A-plate, and the absorption axis 21 of the second polarizer 20 is preferably 100 or less, more preferably 5° or less, and most preferably 0°.

The Rth of the optically anisotropic layer 404 is preferably greater than 60 nm, more preferably 100 nm or greater and 600 nm or less, and still more preferably 300 nm or greater and 500 nm or less. Since the optically anisotropic layer 403 which is the negative A-plate satisfies Rth≈Re/2, the Rth of the retardation layer 305 is the total Rth of the negative A-plate and the optically anisotropic layer 404 which is the negative C-plate.

In a case where the optical characteristics of the retardation layer 305 (the optically anisotropic layer 403 and the optically anisotropic layer 404) are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 12B:
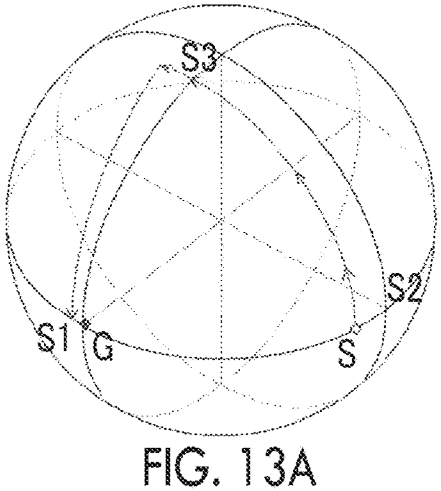
FIG. 12B is a Poincare sphere showing a change in polarization state of the viewing angle control system illustrated in FIG. 12A.

As a specific example, in a case where the Re of the retardation layer 305 is 120 nm, the azimuthal angle of the slow axis 31 is 0°, and the Rth of the retardation layer 305 is 400 nm, FIG. 12B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G. In this case, the Nz coefficient is 3.3.

(Still Another Example of Viewing Angle Control System According to Embodiment of Present Invention)

Figure 13A:
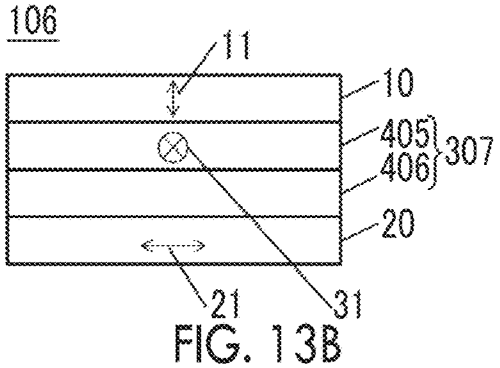
FIG. 13A is a schematic view illustrating an example of the viewing angle control system of the present invention.

FIG. 13A is a schematic view illustrating still another example of the viewing angle control system according to the embodiment of the present invention. A viewing angle control system 106 includes the first polarizer 10, a retardation layer 307 that includes an optically anisotropic layer 405 consisting of a B-plate and an optically anisotropic layer 406 consisting of a positive C-plate, and the second polarizer 20 in this order. That is, the retardation layer 307 includes a B-plate and a positive C-plate, and the B-plate is provided on a side of the first polarizer 10.

The Re of the retardation layer 307 (the total Re of the optically anisotropic layer 405 and the optically anisotropic layer 406) is preferably greater than 80 nm and less than 250 nm, more preferably 100 nm or greater and less than 250 nm, and still more preferably 100 nm or greater and 200 nm or less. Since the optically anisotropic layer 406, which is the positive C-plate, satisfies Re≈0, the Re of the retardation layer 307 is substantially the same as the Re of the optically anisotropic layer 405 which is the B-plate, and the slow axis 31 of the retardation layer 307 is substantially the same as the slow axis of the optically anisotropic layer 405 which is the B−plate.

Further, the Rth of the retardation layer 307 (the total Rth of the optically anisotropic layer 405 and the optically anisotropic layer 406) is preferably less than −60 nm, more preferably −500 nm or greater and −100 nm or less, and still more preferably −400 nm or greater and −200 nm or less.

Further, the slow axis 31 of the retardation layer 307 (the optically anisotropic layer 405 which is the B-plate) forms an azimuthal angle of preferably 80° or greater and 1000 or less, more preferably 85° or greater and 95° or less, and most preferably 90° (that is, perpendicular to the absorption axis 21). That is, the angle between the slow axis 31 of the optically anisotropic layer 405, which is the B-plate, and the absorption axis 21 of the second polarizer 20 is preferably 80° or greater and 100° or less, more preferably 85° or greater and 95° or less, and most preferably 90°.

In a case where the optical characteristics of the retardation layer 307 (the optically anisotropic layer 405 and the optically anisotropic layer 406) are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 13B:
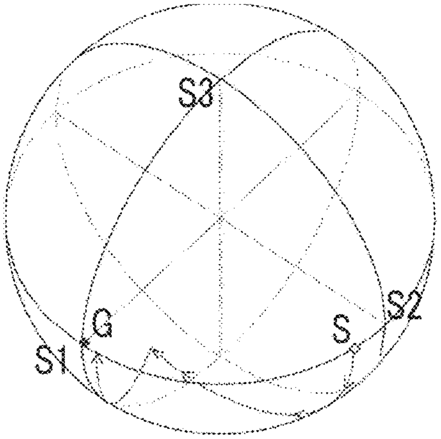
FIG. 13B is a Poincare sphere showing a change in polarization state of the viewing angle control system illustrated in FIG. 13A.

As a specific example, in a case where the Re of the optically anisotropic layer 405 is 120 nm, the Rth thereof is 120 nm, the azimuthal angle of the slow axis 31 is 90°, and the Rth of the optically anisotropic layer 406 is −450 nm, that is, in a case where the Re of the retardation layer 307 is 120 nm, the Rth thereof is −330 nm, and the azimuthal angle of the slow axis 31 is 90°, FIG. 13B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G. In this case, the Nz coefficient is −2.25.

(Still Another Example of Viewing Angle Control System According to Embodiment of Present Invention)

Figure 14A:
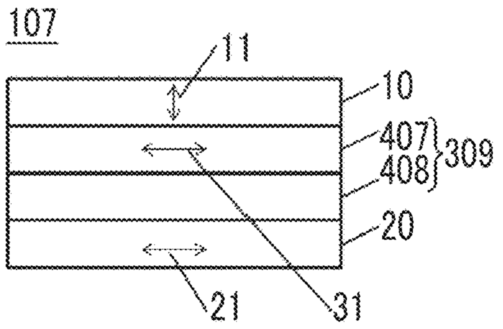
FIG. 14A is a schematic view illustrating an example of the viewing angle control system of the present invention.

FIG. 14A is a schematic view illustrating still another example of the viewing angle control system according to the embodiment of the present invention. A viewing angle control system 107 includes the first polarizer 10, a retardation layer 309 that includes an optically anisotropic layer 407 consisting of a B-plate and an optically anisotropic layer 408 consisting of a negative C-plate, and the second polarizer 20. That is, the retardation layer 309 includes a B-plate and a negative C-plate, and the B-plate is provided on a side of the first polarizer 10.

The Re of the retardation layer 309 (the total Re of the optically anisotropic layer 407 and the optically anisotropic layer 408) is preferably greater than 80 nm and less than 250 nm, more preferably 100 nm or greater and less than 250 nm, and still more preferably 100 nm or greater and 200 nm or less. Further, since the optically anisotropic layer 408, which is the negative C-plate, satisfies Re≈0, the Re of the retardation layer 309 is substantially the same as the Re of the optically anisotropic layer 407 which is the B-plate, and the slow axis 31 of the retardation layer 309 is substantially the same as the slow axis of the optically anisotropic layer 407 which is the B-plate.

Further, the Rth of the retardation layer 309 (the total Rth of the optically anisotropic layer 407 and the optically anisotropic layer 408) is preferably greater than 60 nm, more preferably 100 nm or greater and 600 nm or less, and still more preferably 200 nm or greater and 500 nm or less.

Further, the slow axis 31 of the retardation layer 309 (the optically anisotropic layer 407 which is the B-plate) forms an azimuthal angle of preferably −10° or greater and 10° or less, more preferably −5° or greater and 5° or less, and most preferably 0° (that is, parallel to the absorption axis 21). That is, the angle between the slow axis 31 of the optically anisotropic layer 407, which is the B-plate, and the absorption axis 21 of the second polarizer 20 is preferably 100 or less, more preferably 5° or less, and most preferably 0°.

In a case where the optical characteristics of the retardation layer 309 (the optically anisotropic layer 407 and the optically anisotropic layer 408) are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 14B:
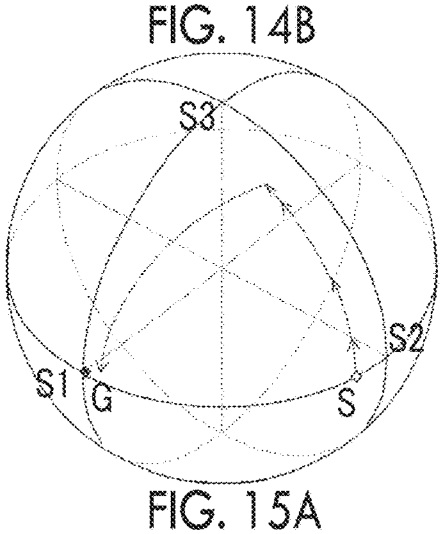
FIG. 14B is a Poincare sphere showing a change in polarization state of the viewing angle control system illustrated in FIG. 14A.

As a specific example, in a case where the Re of the optically anisotropic layer 407 is 120 nm, the Rth thereof is 120 nm, the azimuthal angle of the slow axis 31 is 0°, and the Rth of the optically anisotropic layer 408 is 250 nm, that is, in a case where the Re of the retardation layer 309 is 120 nm, the Rth thereof is 370 nm, and the azimuthal angle of the slow axis 31 is 0°, FIG. 14B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G. In this case, the Nz coefficient is 3.58.

(Still Another Example of Viewing Angle Control System According to Embodiment of Present Invention)

Figure 15A:
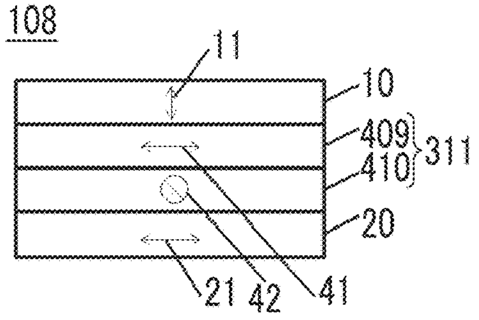
FIG. 15A is a schematic view illustrating an example of the viewing angle control system of the present invention.

FIG. 15A is a schematic view illustrating still another example of the viewing angle control system according to the embodiment of the present invention. A viewing angle control system 108 includes the first polarizer 10, a retardation layer 311 that includes an optically anisotropic layer 409 consisting of a B-plate and an optically anisotropic layer 410 consisting of a positive A-plate, and the second polarizer 20 in this order. That is, the retardation layer 311 includes a B-plate and a positive A-plate, and the B-plate is provided on a side of the first polarizer 10.

The Re of the optically anisotropic layer 409 and the optically anisotropic layer 410 is preferably greater than 80 nm, more preferably 100 nm or greater and 300 nm or less, and still more preferably 100 nm or greater and 250 nm or less.

The total Rth of the optically anisotropic layer 409 and the optically anisotropic layer 410 is preferably greater than 60 nm, more preferably 100 nm or greater and 600 nm or less, and still more preferably 200 nm or greater and 500 nm or less.

Further, the slow axis 41 of the optically anisotropic layer 409 forms an azimuthal angle of preferably −10° or greater and 100 or less, more preferably −5° or greater and 5° or less, and most preferably 0° (that is, parallel to the absorption axis 21).

Further, the slow axis 42 of the optically anisotropic layer 410 forms an azimuthal angle of preferably 80° or greater and 100° or less, more preferably 85° or greater and 950 or less, and most preferably 900 (that is, perpendicular to the absorption axis 21).

In a case where the optical characteristics of the optically anisotropic layer 409 and the optically anisotropic layer 410 are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 15B:
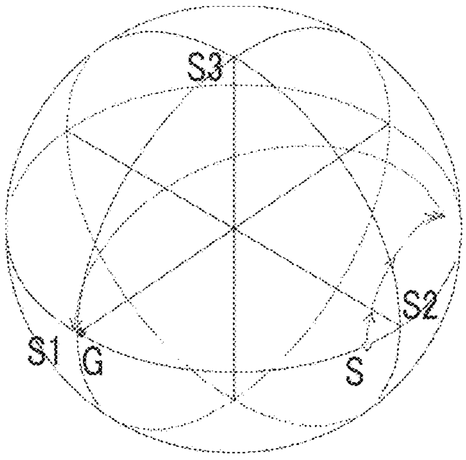
FIG. 15B is a Poincare sphere showing a change in polarization state of the viewing angle control system illustrated in FIG. 15A.

As a specific example, in a case where the Re of the optically anisotropic layer 409 is 210 nm, the Rth thereof is 300 nm, the Nz coefficient is 1.9, the azimuthal angle of the slow axis 41 is 0°, the Re of the optically anisotropic layer 410 is 200 nm, the Nz coefficient is 2.5, and the azimuthal angle of the slow axis 32 is 90°, FIG. 15B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G.

(Still Another Example of Viewing Angle Control System According to Embodiment of Present Invention)

Figure 16A:
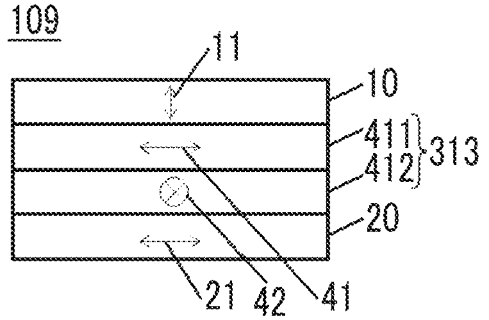
FIG. 16A is a schematic view illustrating an example of the viewing angle control system of the present invention.

FIG. 16A is a schematic view illustrating still another example of the viewing angle control system according to the embodiment of the present invention. A viewing angle control system 109 includes the first polarizer 10, a retardation layer 313 that includes an optically anisotropic layer 411 consisting of a B-plate and an optically anisotropic layer 412 consisting of a B-plate, and the second polarizer 20 in this order.

The Re of the optically anisotropic layer 411 and the optically anisotropic layer 412 is preferably greater than 80 nm, more preferably 100 nm or greater and 300 nm or less, and still more preferably 100 nm or greater and 250 nm or less.

Further, the total Rth of the optically anisotropic layer 411 and the optically anisotropic layer 412 is preferably greater than 60 nm, more preferably 100 nm or greater and 700 nm or less, and still more preferably 200 nm or greater and 600 nm or less.

Further, the slow axis 41 of the optically anisotropic layer 411 forms an azimuthal angle of preferably −10° or greater and 100 or less, more preferably −5° or greater and 5° or less, and most preferably 0° (that is, parallel to the absorption axis 21).

In a case where the optical characteristics of the optically anisotropic layer 411 and the optically anisotropic layer 412 are in the above-described ranges, the viewing angle control system is visually recognized obliquely in an azimuth that is not horizontal or perpendicular to the absorption axis 21 in the plane of the film, the vertical deviation between the absorption axis 11 and the absorption axis 21 can be compensated, and the transmittance in the direction can be reduced.

Figure 16B:
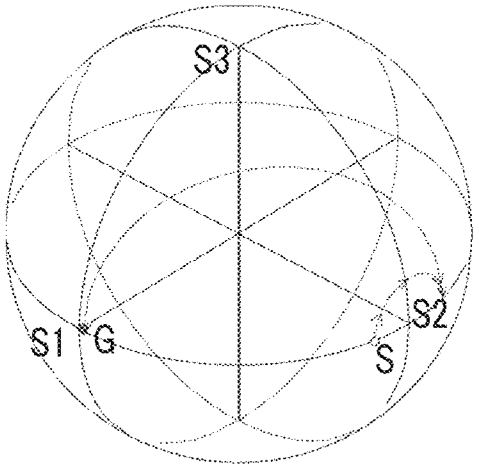
FIG. 16B is a Poincare sphere showing a change in polarization state of the viewing angle control system illustrated in FIG. 16A.

As a specific example, in a case where the Re of the optically anisotropic layer 411 is 150 nm, the Rth thereof is 210 nm, the Nz coefficient is 1.9, the azimuthal angle of the slow axis 31 is 0°, the Re of the optically anisotropic layer 412 is 220 nm, the Rth thereof is 400 nm, the Nz coefficient is 2.3, and the azimuthal angle of the slow axis 32 is 90°, FIG. 16B shows a Poincare sphere showing a change in the polarization state in a case where the viewing angle control system is visually recognized at an azimuthal angle of 45° and a polar angle of 60°. It was found that the polarization state of the point S is converted to the polarization state close to the point G.

Hereinafter, an optical member that can be used in the viewing angle control system according to the embodiment of the present invention will be described in detail.

(First Polarizer)

The first polarizer in the present invention has an absorption axis forming an angle of 45° or greater with respect to the surface in the direction of the absorption axis. The direction of the absorption axis of the first polarizer coincides with the direction in which the transmittance of the viewing angle control system is maximized. Further, as a preferable aspect in each of the above-described examples, the absorption axis of the first polarizer is configured to be perpendicular to the surface of the viewing angle control system (first polarizer).

For example, in a case where the viewing angle control system is used to prevent peeping into an image display device, it is preferable to maximize the transmittance in the front direction. In this case, the direction of the absorption axis of the first polarizer may be made to coincide with the normal direction of the film so that the direction thereof is perpendicular to the surface.

Further, the absorption axis of the first polarizer may be set to be in different directions depending on the location. For example, in an in-vehicle display having a curved display surface, it is preferable that the direction of the absorption axis of the first polarizer is adjusted according to the curved surface in order to prevent light emitted from any position from being reflected on the windshield or the like and to allow the driver to appropriately visually recognize the displayed image.

[Light Absorption Anisotropic Layer]

The first polarizer in the present invention can have a light absorption anisotropic layer in which at least one dichroic substance is aligned perpendicular to the film surface. The light absorption anisotropic layer can also contain a plurality of kinds of dichroic substances. For example, it is preferable that the light absorption anisotropic layer contains a cyan coloring agent exhibiting a dichroic property in a wavelength range of a red color, a magenta coloring agent exhibiting the dichroic property in a wavelength range of a green color, and a yellow coloring agent exhibiting the dichroic property in a wavelength range of a blue color. In a case where the light absorption anisotropic layer contains a plurality of kinds of dichroic substances, the tint can be made neutral and the viewing angle control effect can be exhibited over the entire wavelength range of visible light.

Further, the dichroic substance is a substance exhibiting the dichroic property, and the dichroic property denotes a property in which the absorbance varies depending on the polarization direction.

The degree of alignment of the dichroic substance at a wavelength of 550 nm is preferably 0.95 or greater. In a case where the degree of alignment of the dichroic substance is 0.95 or greater, the transmittance in the direction of the absorption axis (that is, the direction in which light is expected to be transmitted) can be increased. Further, from the viewpoint of making the tint neutral, the degree of alignment of the dichroic substance at a wavelength of 420 nm is preferably 0.93 or greater.

The thickness of the light absorption anisotropic layer is not particularly limited, but is preferably in a range of 100 to 8000 nm and more preferably in a range of 300 to 5000 nm from the viewpoint of the flexibility.

[Dichroic Substance]

The dichroic substance used in the present invention is not particularly limited as long as the dichroic substance is a substance exhibiting the dichroic property, and examples thereof include a dichroic coloring agent, a dichroic azo compound, an ultraviolet absorbing substance, an infrared absorbing substance, a nonlinear optical substance, carbon nanotubes, anisotropic metal nanoparticles, and an inorganic substance. A dichroic azo coloring agent compound is particularly preferable as the dichroic substance.

The dichroic azo coloring agent compound used in the present invention is not particularly limited, and a known dichroic azo coloring agent of the related art can be used. The dichroic azo coloring agent compound may or may not exhibit liquid crystallinity. In a case where the dichroic azo coloring agent compound exhibits liquid crystallinity, the dichroic azo coloring agent compound may exhibit any of nematic liquid crystallinity or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In the present invention, from the viewpoint of further enhancing pressing resistance, it is preferable that the dichroic azo coloring agent compound contains a crosslinkable group. Specific examples of the crosslinkable group include a (meth)acryloyl group, an epoxy group, an oxetanyl group, and a styryl group. Among these, a (meth)acryloyl group is preferable.

In a case where the dichroic substance is anisotropic metal nanoparticles, it is preferable that the material of the anisotropic metal nanoparticles is at least one selected from gold, silver, copper, or aluminum.

[Liquid Crystal Compound]

The light absorption anisotropic layer in the first polarizer may contain a liquid crystal compound. In a case where the light absorption anisotropic layer contains a liquid crystal compound, the dichroic substances can be aligned with a high degree of alignment while the precipitation of the dichroic substances is suppressed.

As the liquid crystal compound, any of a low-molecular-weight liquid crystal compound or a polymer liquid crystal compound can also be used, and it is preferable that both are used in combination. Here, the "low-molecular-weight liquid crystal compound" indicates a liquid crystal compound having no repeating units in the chemical structure. Here, "polymer liquid crystal compound" denotes a liquid crystal compound having a repeating unit in the chemical structure.

Examples of the low-molecular-weight liquid crystal compound include liquid crystal compounds described in JP2013-228706A.

Examples of the polymer liquid crystal compound include thermotropic liquid crystal polymers described in JP2011-237513A. Further, from the viewpoint of enhancing the strength (particularly, the bending resistance of the film), it is preferable that the polymer liquid crystal compound has a repeating unit containing a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In a case where the light absorption anisotropic layer contains a polymer liquid crystal compound, it is preferable that the polymer liquid crystal compound forms a nematic liquid crystal phase. The temperature at which the nematic liquid crystal phase is exhibited is preferably in a range of room temperature (23° C.) to 450° C. and more preferably in a range of 50° C. to 400° C. from the viewpoints of handleability and manufacturing suitability.

The content of the liquid crystal compound in the light absorption anisotropic layer is preferably in a range of 25 to 2000 parts by mass, more preferably in a range of 100 to 1300 parts by mass, and still more preferably in a range of 200 to 900 parts by mass with respect to 100 parts by mass of the content of the dichroic substances. In a case where the content of the liquid crystal compound is in the above-described ranges, the degree of alignment of the dichroic substance is further improved.

The liquid crystal compound may contain only one or two or more kinds of liquid crystal compounds. In a case where the liquid crystal compound contains two or more kinds of liquid crystal compounds, the content of the liquid crystal compounds indicates the total content of the liquid crystal compounds.

[Additive]

The light absorption anisotropic layer in the first polarizer may further contain additives such as a solvent, a vertical alignment agent, an interface improver, a leveling agent, a polymerizable component, a polymerization initiator (for example, a radical polymerization initiator), and a durability improver. Known additives can be appropriately used as the additives.

[Base Material Layer]

The first polarizer may have a base material layer.

The base material layer is not particularly limited, but a transparent film or a transparent sheet is preferable, and examples thereof include known transparent resin films, transparent resin plates, transparent resin sheets, and glass. Examples of the transparent resin films include a cellulose acylate film (such as a cellulose triacetate film, a cellulose diacetate film, a cellulose acetate butyrate film, and a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth) acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the transparent base material film is preferably in a range of 20 μm to 100 μm.

[Alignment Film]

The first polarizer may have an alignment film between the base material layer and the light absorption anisotropic layer.

The alignment film may be any layer as long as the dichroic substance can be in a desired alignment state on the alignment film.

For example, a film formed of a polyfunctional acrylate compound or polyvinyl alcohol may be used. Polyvinyl alcohol is particularly preferable.

[Barrier Layer]

It is preferable that the first polarizer has a barrier layer together with the light absorption anisotropic layer.

Here, the barrier layer is also referred to as a gas barrier layer (oxygen barrier layer) and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

In the first polarizer, the above-described light absorption anisotropic layer contains a dichroic substance, and internal reflection due to the high refractive index of the light absorption anisotropic layer may be a problem. In that case, it is preferable that the refractive index adjusting layer is present. The refractive index adjusting layer is a refractive index adjusting layer that is disposed to be in contact with the light absorption anisotropic layer and performs so-called index matching, and the in-plane average refractive index at a wavelength of 550 nm is preferably 1.55 or greater and 1.70 or less.

[Tint Adjusting Layer]

The first polarizer may include a tint adjusting layer containing at least one coloring agent compound. In a case where the amount of the coloring agent in the light absorption anisotropic layer is adjusted, a change in tint as viewed in an oblique direction with respect to the absorption axis is increased, but the change in tint in the oblique direction with respect to the absorption axis can be suppressed by adjusting the tint using the tint adjusting layer. The tint adjusting layer may have only the function of the tint adjusting layer or may have functions integrated with functions of other layers.

The absorption peak wavelength of the coloring agent compound contained in the tint adjusting layer used in the present invention is preferably 500 nm or greater and 650 nm or less and more preferably 550 nm or greater and 600 nm or less. The tint of the optical film in the present invention can be adjusted to be more neutral by setting the absorption of the coloring agent compound to be in the above-described ranges.

Examples of the coloring agent compound contained in the tint adjusting layer include azo, methine, anthraquinone, triarylmethane, oxazine, azomethine, phthalocyanine, porphyrin, perylene, pyrrolopyrrole, and squarylium. Among these, from the viewpoints of enhancing the absorption waveform, the heat resistance, and the light resistance, azo, phthalocyanine, and anthraquinone are preferable, and anthraquinone is particularly preferable. Other examples thereof include coloring agent compounds described in "Functional Coloring Agents", co-authored by Shin Okawara, Ken Matsuoka, Tsuneaki Hirashima, and Eijiro Kitao, Kodansha Ltd., 1992, supervised by Sumio Tokita, and "Electronics-related Materials", CMC Publishing Co., Ltd., 1998.

Specific examples of the coloring agent compound used in the present invention are shown below, but the present invention is not limited thereto.

Anthraquinone

A-1

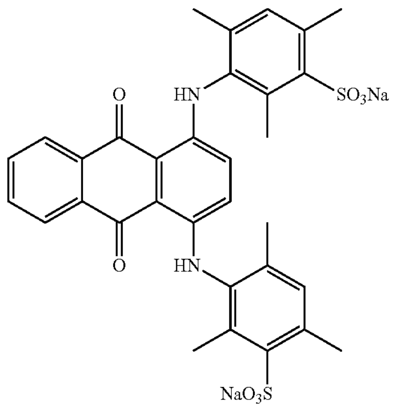

A-2

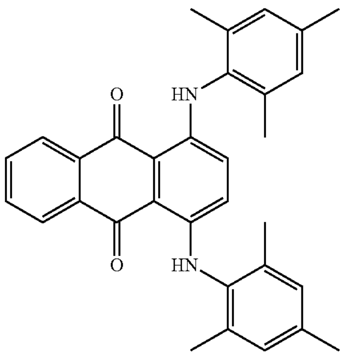

A-3

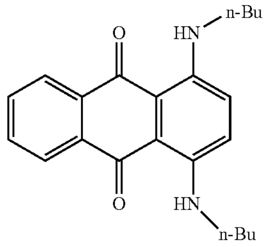

A-4

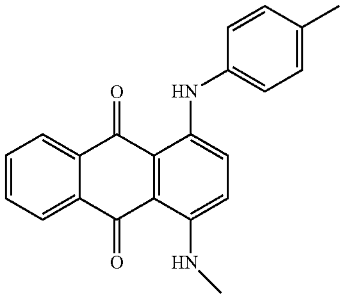

A-5

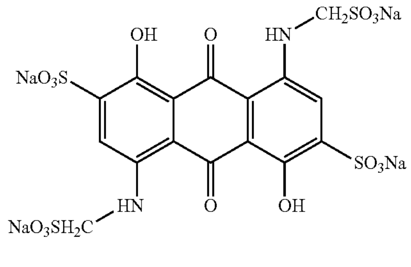

A-6

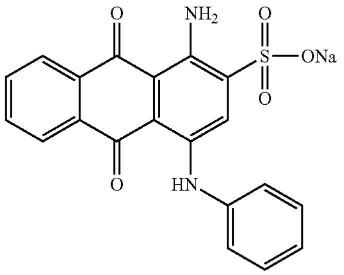

-continued
A-7
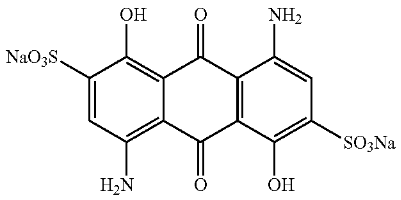
A-8
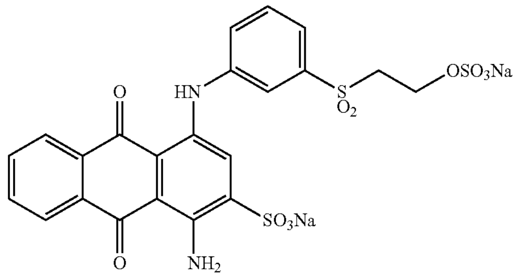
A-9
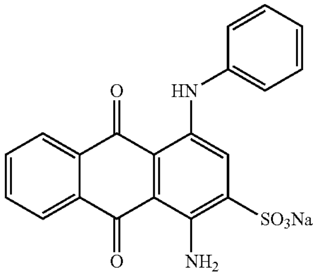
A-10
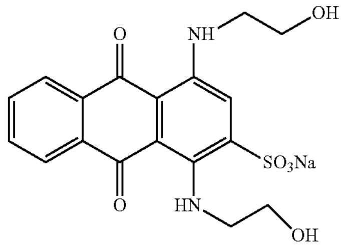
A-11
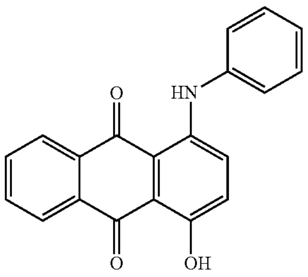
A-12
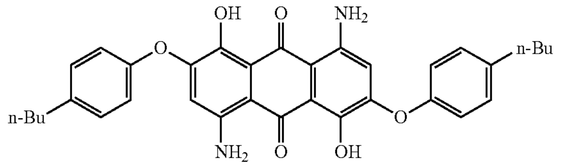
Azo
B-1
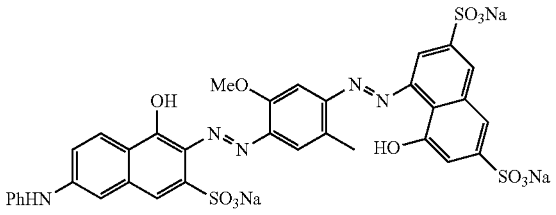
B-2
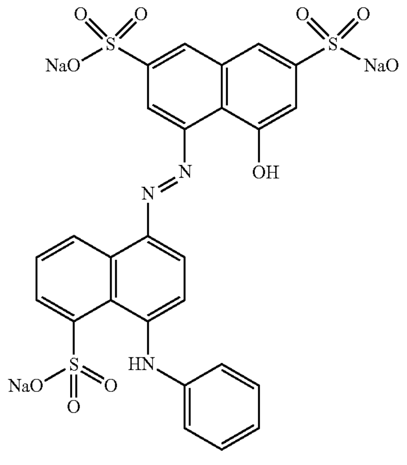
B-3
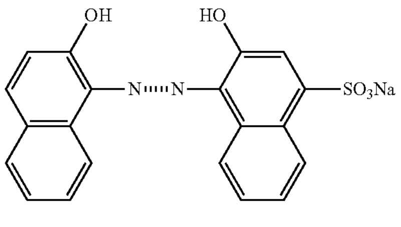
B-4
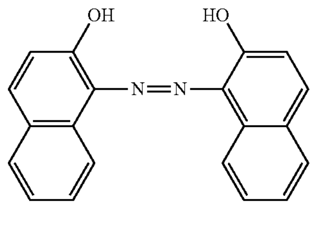

-continued
B-5
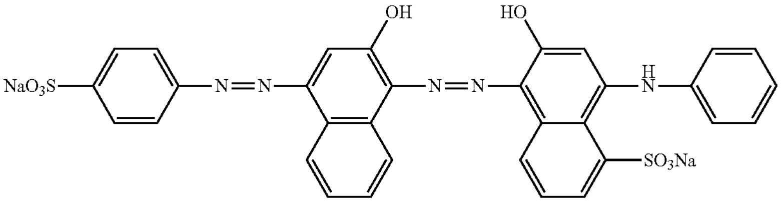
B-6
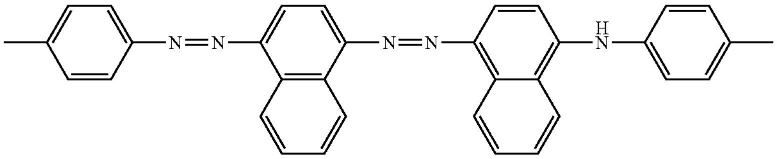
Triarylmethane
T-1
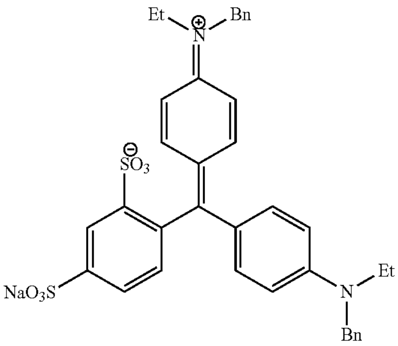
T-2
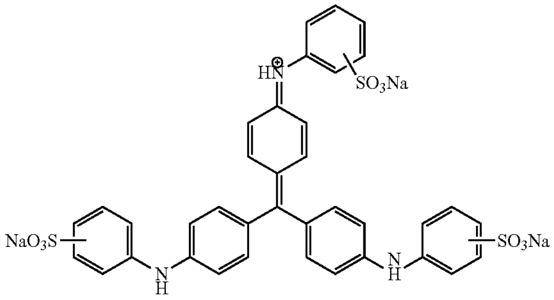
Oxazine
O-1
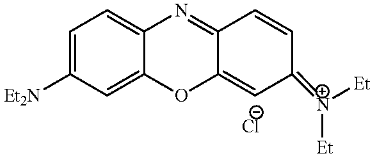
O-2
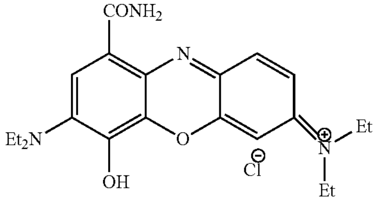
Phthalocynanine
PH-1
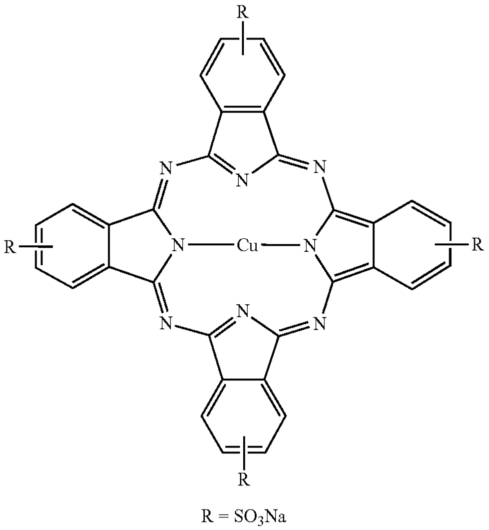
R = $SO_3Na$

[Method of Forming Light Absorption Anisotropic Layer]

A method of forming the light absorption anisotropic layer is not particularly limited, and examples thereof include a method of sequentially performing a step of applying a composition for forming a light absorption anisotropic layer to form a coating film (hereinafter, also referred to as "coating film forming step") and a step of aligning the liquid crystal component and the dichroic substance contained in the coating film (hereinafter, also referred to as "aligning step").

Further, the liquid crystal component is a component that also includes a dichroic substance having liquid crystallinity in a case where the above-described dichroic substance has liquid crystallinity, in addition to the above-described liquid crystal compound.

[Coating Film Forming Step]

The coating film forming step is a step of applying a composition for forming a light absorption anisotropic layer to form a coating film.

The composition for forming a light absorption anisotropic layer can be easily applied by using the composition for forming a light absorption anisotropic layer which contains a solvent or using a liquid such as a melt obtained by heating the composition for forming a light absorption anisotropic layer.

Examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

[Aligning Step]

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal component contained in the composition for forming a light absorption anisotropic layer may be aligned by the coating film forming step or the drying treatment described above. For example, in an aspect in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film from a liquid crystal phase to an isotropic phase, the heat treatment described below may not be performed.

The transition temperature of the liquid crystal component contained in the coating film from a liquid crystal phase to an isotropic phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case where the coating film is heated until the phase transition to the isotropic phase is made for the purpose of suppressing alignment defects and waste of heat energy and deformation and deterioration of the substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

[Other Steps]

The method of forming the light absorption anisotropic layer may include a step of curing the light absorption anisotropic layer after the aligning step (hereinafter, also referred to as a "curing step").

The curing step is performed by heating the light absorption anisotropic layer and/or irradiating the layer with light (exposing the layer to light), for example, in a case where the light absorption anisotropic layer contains a crosslinkable group (polymerizable group). From the viewpoint of the productivity, it is preferable that the curing step is performed by light irradiation.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

In a case where the exposure is performed while the film is heated, the heating temperature during the exposure depends on the transition temperature of the liquid crystal component contained in the liquid crystal film, but is preferably in a range of 250 to 140° C.

Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

(Other Forms of First Polarizer)

The first polarizer may be a polarizer that contains a dichroic coloring agent and a guest-host liquid crystal material and can electrically drive the alignment direction of the dichroic coloring agent, as described in, for example, JP2013-541727A. In this case, a state in which the viewing angle is limited and a state in which the viewing angle is not limited can be electrically switched to each other, which is preferable. Further, the above-described case is also preferable from the viewpoint of electrically controlling the direction of the absorption axis of the dichroic coloring agent.

(Retardation Layer)

The retardation layer in the present invention is provided between the first polarizer and the second polarizer. The retardation layer is formed of one or two or more layers, but in the present invention, it is preferable that the retardation layer is formed of one or two layers.

From the viewpoint of reducing the thickness of the viewing angle control system, it is preferable that the thickness of the retardation layer is small as long as the optical characteristics, the mechanical properties, and the manufacturing suitability are not impaired, and specifically, the thickness thereof is preferably in a range of 1 to 150 μm, more preferably in a range of 1 to 70 μm, and still more preferably in a range of 1 to 30 μm.

From the viewpoint of ease of production or the like, it is preferable that the retardation layer is a polymer film or a film formed of a liquid crystal compound.

As the polymer film, a cellulose acylate-based film, a cycloolefin-based polymer film (a polymer film formed of a cycloolefin-based polymer), a polycarbonate-based polymer film, a polystyrene-based polymer film, or an acrylic polymer film is preferable. It is preferable that the acrylic polymer film contains an acrylic polymer having at least one unit selected from a lactone ring unit, a maleic acid anhydride unit, or a glutaric anhydride unit.

[Retardation Layer Formed of Liquid Crystal Compound]

As the retardation layer formed of a liquid crystal compound, a film fixed in a state in which the liquid crystal compound is aligned is preferable. Among such films, a film obtained by applying a composition containing a liquid crystal compound that contains a polymerizable group to form a coating film, aligning the liquid crystal compound in the coating film, performing a curing treatment on the coating film, and fixing the alignment of the liquid crystal compound is more preferable.

Examples of the liquid crystal compound include a rod-like liquid crystal compound and a disk-like liquid crystal compound, and it is preferable that the liquid crystal compound contains a polymerizable group for fixing the alignment state. The rod-like liquid crystal compound can be suitably used for preparing a positive A-plate or a positive C-plate. Further, the disk-like liquid crystal compound can be suitably used for preparing a negative A-plate or a negative C-plate.

Further, the retardation layer formed of a liquid crystal compound is advantageous for reducing the thickness, and the thickness thereof is also easily set to 10 m or less.

It is also preferable to use a liquid crystal compound exhibiting a wavelength dispersibility of reverse dispersion as the liquid crystal compound. Examples thereof include the liquid crystal compound exhibiting the wavelength dispersibility of reverse dispersion described in the pamphlet of WO2017/043438A. The retardation layer formed of the liquid crystal compound exhibiting the wavelength dispersibility of reverse dispersion can perform optical compensation over the entire wavelength range of visible light in the viewing angle control system.

Here, the wavelength dispersibility of reverse dispersion denotes that the values of the Re (λ) and the Rth (λ) increase as the wavelength λ increases.

In a case where the retardation layer is a film formed of a liquid crystal compound, the retardation layer may have an alignment film. The alignment film typically contains a polymer as a main component. The polymer material for the alignment film is described in multiple documents, and multiple commercially available products can be obtained. As the polymer material to be used, polyvinyl alcohol or polyimide and derivatives thereof are preferable. Modified or unmodified polyvinyl alcohol is particularly preferable. As the alignment film that can be used in the present invention, the modified polyvinyl alcohols and the like described from the 24th line on page 43 to the 8th line on page 49 of WO01/88574A1 and paragraphs [0071] to [0095] of JP3907735A can be referred to. Further, the above-described alignment film is typically subjected to a known rubbing treatment.

From the viewpoint of imparting the alignment ability for forming a retardation layer and relaxing the surface unevenness of the film to form a retardation layer having a uniform film thickness, it is preferable that the thickness of the alignment film is small, but the alignment film is required to have a certain thickness. Specifically, the thickness of the alignment film is preferably in a range of 0.01 to 10 μm, more preferably in a range of 0.01 to 1 m, and still more preferably in a range of 0.01 to 0.5 μm.

In the present invention, it is also preferable that a photo-alignment film is used. Although the photo-alignment film is not particularly limited, those described in paragraphs [0024] to [0043] of WO2005/096041A and LPP-JP265CP (trade name, manufactured by Rolic Technologies Ltd.) can be suitably used.

[Retardation Layer Obtained by Using Polymer Film]

The retardation layer is also obtained by stretching the polymer film. Specifically, the retardation layer is obtained by performing a stretching treatment using a machine-direction stretching method by controlling the circumferential speed of a roll, a cross-direction stretching method with a tenter, or a biaxial stretching method, on the polymer film (for example, a cellulose acylate film, a cyclic polyolefin film, a polycarbonate film, a polystyrene film, or a copolymer containing methyl methacrylate, styrene, and maleic acid anhydride) produced by an appropriate method such as a melt film forming method or a solution film forming method. Specifically, the description in JP2005-338767A can be referred to.

Further, for example, the retardation layer can also be prepared by a method of bonding a shrinkable film to one or both surfaces of the polymer film and heating and stretching the film to be stretched in the thickness (nz) direction as described in JP1993-157911A (JP-H5-157911A), JP2006-072309A, or JP2007-298960A.

The polymer film can be suitably used, for example, to prepare a B-plate.

It is preferable to use a polymer film exhibiting negative intrinsic birefringence in order to prepare a retardation layer having a negative Nz coefficient, and for example, a film or the like formed of a blend of a copolymer of methyl methacrylate-methyl acrylate and a styrene-maleic acid anhydride copolymer, described in Example 19 of JP2008-262182A, can be used.

As the polymer film, it is also preferable to use a polymer film exhibiting wavelength dispersibility of reverse dispersion. As the polymer film exhibiting wavelength dispersibility of reverse dispersion, for example, a modified polycarbonate film is known.

(Viewing Angle Control Polarizing Plate)

The viewing angle control polarizing plate t of the present invention is formed by laminating at least the first polarizer and the retardation layer.

The viewing angle control polarizing plate of the present invention can be used by being combined with the second polarizer to prepare the viewing angle control system according to the embodiment of the present invention. In typical liquid crystal display devices and organic EL display devices, a polarizing plate having an absorption axis in the in-plane direction of the display surface is laminated in many cases. Therefore, the viewing angle control polarizing plate of the present invention is highly convenient from the viewpoint that the viewing angle control polarizing plate can be subsequently bonded to the polarizing plate that has been already attached to a liquid crystal display device or an organic EL display device to prepare the viewing angle control system according to the embodiment of the present invention.

(Second Polarizer)

The second polarizer in the present invention is formed such that the direction of the absorption axis is horizontal to the film surface.

As the second polarizer, a polarizer in which a dichroic substance is horizontally aligned can be used. For example, a polarizer in which a dichroic substance is horizontally aligned by dyeing and stretching the dichroic substance on polyvinyl alcohol or another polymer resin or a polarizer in which a dichroic substance is horizontally aligned by applying alignment of a liquid crystal compound as in a case of the light absorption anisotropic layer of the present invention may be employed.

A polarizer obtained by stretching polyvinyl alcohol and dyeing the polyvinyl alcohol with iodine is commonly used as a polarizer layer of a polarizing plate provided in a liquid crystal display device or an organic EL display device. Therefore, in a case where the viewing angle control system according to the embodiment of the present invention is used for a liquid crystal display device or an organic EL display device, the polarizing plate provided in the liquid crystal display device or the organic EL display device may also serve as the second polarizer of the present invention.

Further, the second polarizer may be a reflective polarizer or a laminate of an absorption type polarizer (typical polarizer) and a reflective polarizer. A reflective polarizer is a polarizer that reflects one polarized light and transmits the other polarized light. Further, the reflective polarizer has a reflection axis and a transmission axis in the plane, but the reflection axis functions in the same manner as the absorption axis in a typical polarizer in terms that the reflection axis does not transmit polarized light in the azimuth, and thus the reflection axis can be read as the absorption axis in the present specification.

In a case where the second polarizer is a reflective polarizer, since light that is not transmitted through the reflective polarizer is reflected, the reflected light is reused and thus light utilization efficiency can be increased, for example, in a case where the viewing angle control system is incorporated in a backlight of a liquid crystal display device.

As the reflective polarizer, a brightness-improving film "DBEF" or "APF" (manufactured by 3M Company), a wire grid polarizing film "WGF" (manufactured by Asahi Kasei Corporation), or the like can be suitably used.

(Viewing Angle Control System)

The viewing angle control system according to the embodiment of the present invention includes at least the first polarizer, the retardation layer, and the second polarizer in this order, but may include other functional layers. Examples of other functional layers may include a pressure sensitive adhesive layer, an adhesive layer, an antireflection layer, and a protective layer.

A method of producing the viewing angle control system may include a step of respectively preparing the first polarizer, the retardation layer, the second polarizer, and other functional layers and bonding these with a pressure sensitive adhesive or an adhesive.

Further, the method may also include a step of transferring the retardation layer formed on the base material to the second polarizer (bonding the retardation layer to the second polarizer and peeling the base material off) and a step of transferring the first polarizer formed on the base material to the retardation layer.

Further, the method may also include a step of preparing the retardation layer by directly coating the first polarizer with the retardation layer and a step of directly forming the first polarizer on the retardation layer after the formation of the retardation layer.

Each step can be carried out by a known method and the present invention is not particularly limited thereto.

(Image Display Device)

The viewing angle control system according to the embodiment of the present invention can be used for an optional image display device.

The image display device is not particularly limited, and examples thereof include a liquid crystal display device, an organic EL display device, a micro LED display device, a head-up display, and a head-mounted display.

A liquid crystal display device typically includes a liquid crystal cell and a backlight, and a polarizing plate is provided on both the viewing side and the backlight side of the liquid crystal cell. The viewing angle control system according to the embodiment of the present invention can be applied to any one or both surfaces on the viewing side or the backlight side of the liquid crystal display device. The application of the viewing angle control system to a liquid crystal display device can be realized by replacing the polarizing plate on any one or both surfaces of the liquid crystal display device with the viewing angle control system according to the embodiment of the present invention. Alternatively, the viewing angle control system can be applied to a liquid crystal display device by bonding the polarizing plate for the viewing angle control system according to the embodiment of the present invention to the polarizing plate on any one or both surfaces of the liquid crystal display device. Further, the polarizer of the liquid crystal display device may be used as the second polarizer of the viewing angle control system according to the embodiment of the present invention.

In a case where the viewing angle control system according to the embodiment of the present invention is applied to a liquid crystal display device, it is preferable that the second polarizer is disposed on a side closer to the liquid crystal cell with respect to the first polarizer from the viewpoint of enhancing the display performance of the liquid crystal display device. Further, in a case where the viewing angle control system according to the embodiment of the present invention is applied to the backlight side of the liquid crystal display device, it is preferable that the second polarizer is a reflective polarizer or a laminate of a typical polarizer and a reflective polarizer from the viewpoint of increasing the light utilization efficiency.

Some image display devices are thin and can be molded into a curved surface. The viewing angle control system according to the embodiment of the present invention is thin and easily bent and thus can be suitably applied to an image display device having a curved display surface.

Further, some image display devices have a pixel density of greater than 250 ppi and are capable of high-definition display. The viewing angle control system according to the embodiment of the present invention can be suitably applied to such a high-definition image display device without causing moire.

EXAMPLES

Hereinafter, the present invention will be described in more detail based on the following examples. The materials, the reagents, the amounts of materials and the proportions of the materials, the operations, and the like shown in the following examples can be appropriately changed within a range not departing from the scope of the present invention. Therefore, the scope of the present invention is not limited to the following specific examples.

[Preparation of First Polarizer]

Various first polarizers 10 used in examples and comparative examples of the present invention were prepared as follows.

<Preparation of Transparent Support 1 with Alignment Film>

A surface of a cellulose acylate film (TAC base material having a thickness of 40 μm; TG40, manufactured by FUJIFILM Corporation) was saponified with an alkaline solution and coated with the following coating solution 1 for forming an alignment layer using a wire bar. The cellulose acylate film on which the coating film had been formed was dried with hot air at 60° C. for 60 seconds and further dried with hot air at 100° C. for 120 seconds to form an alignment layer PA1, thereby obtaining a transparent support 1 with an alignment layer.

The film thickness of the alignment film PA1 was 0.5 m.

| (Coating solution 1 for forming alignment layer) |
|---|
| •Modified polyvinyl alcohol shown below: 3.80 parts by mass<br>•Initiator Irg2959: 0.20 parts by mass<br>Water: 70 parts by mass<br>•Methanol: 30 parts by mass |

Modified polyvinyl alcohol

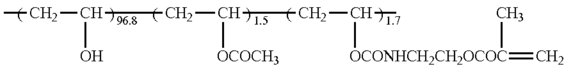

<Formation of Light Absorption Anisotropic Layer P1>

The obtained alignment layer PA1 was continuously coated with the following composition 1 for forming a light absorption anisotropic layer with a wire bar to form a coating layer.

Next, the coating layer was heated at 140° C. for 30 seconds and cooled to room temperature (23° C.).

Next, the coating layer was heated at 80° C. for 60 seconds and cooled to room temperature again.

Thereafter, the coating layer was irradiated with an LED lamp (center wavelength of 365 nm) for 2 seconds under an irradiation condition of an illuminance of 200 $mW/cm^2$, thereby preparing a light absorption anisotropic layer P1 on the alignment layer PA1.

The film thickness of the light absorption anisotropic layer P1 was 3 μm, and the degree of alignment thereof was 0.96. The light absorption anisotropic layer P1 with a support obtained above was used as a first polarizer 10.

| (Composition 1 for forming light absorption anisotropic layer) |
|---|
| Dichroic substance D-1 shown below: 0.40 parts by mass<br>•Dichroic substance D-2 shown below: 0.15 parts by mass<br>•Dichroic substance D-3 shown below: 0.63 parts by mass<br>•Polymer liquid crystal compound P-1 shown below: 3.20 parts by mass<br>•Low-molecular-weight liquid crystal compound M-1 shown above: 0.45 parts by mass<br>•Polymerization initiator IRGACURE OXE-02 (manufactured by BASF SE): 0.040 parts by mass<br>•Compound E-1 shown below: 0.060 parts by mass<br>•Compound E-2 shown below: 0.060 parts by mass<br>•Surfactant F-1 shown below: 0.010 parts by mass<br>Surfactant F-2 shown below: 0.015 parts by mass<br>Cyclopentanone: 47.00 parts by mass<br>•Tetrahydrofuran: 47.00 parts by mass<br>•Benzyl alcohol: 1.00 parts by mass |

]Dichroic substance D-1

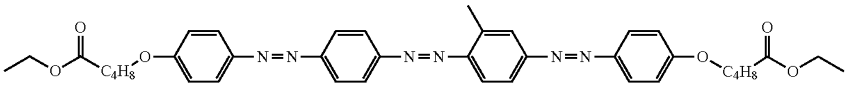

Dichroic substance D-2

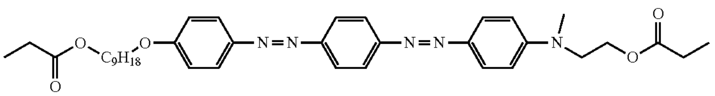

Dichroic substance D-3

Polymer liquid crystal compound P-1

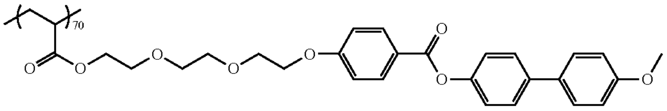

-continued (Composition 1 for forming light absorption anisotropic layer)

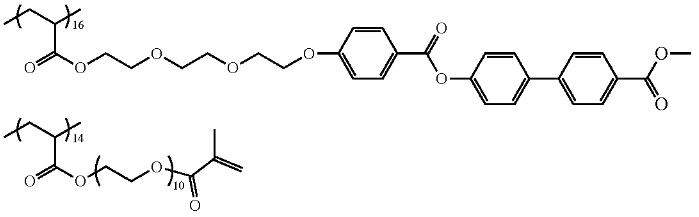

Low-molecular-weight liquid crystal compound M-1

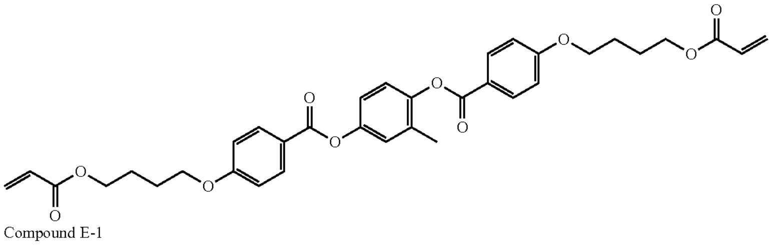

Compound E-1

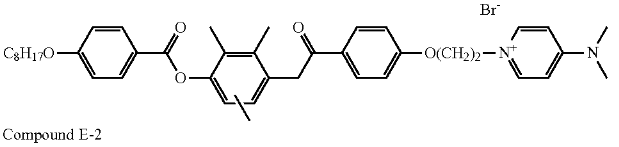

Compound E-2

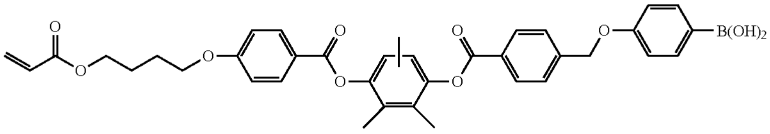

Surfactant F-1

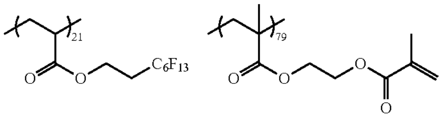

Surfactant F-2

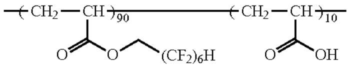

<Formation of Light Absorption Anisotropic Layer P2>

A light absorption anisotropic layer P2 was prepared by changing only the composition P1 for forming a light absorption anisotropic layer to the following composition P2 for forming a light absorption anisotropic layer and coating the light absorption anisotropic layer P1 with the composition.

The film thickness of the light absorption anisotropic layer P2 was 3 μm, and the degree of alignment thereof was 0.96. The angle between the transmittance central axis of the light absorption anisotropic layer P2 and the film normal line was 0 degrees. The light absorption anisotropic layer P2 with a support obtained above was used as a first polarizer 10B.

| Composition of composition P2 for forming light absorption anisotropic layer |
| --- |
| •Dichroic substance D-1 shown below: 0.69 parts by mass |
| •Dichroic substance D-2 shown below: 0.17 parts by mass |
| •Dichroic substance D-4 shown below: 1.13 parts by mass |
| •Polymer liquid crystal compound P-2 shown below: 6.58 parts by mass |
| •Low-molecular-weight liquid crystal compound M-1 shown above: 4.06 parts by mass |
| Polymerization initiator IRGACURE OXE-02 (manufactured by BASF SE): 0.20 parts by mass |
| •Compound E-1 shown above: 0.16 parts by mass |
| •Compound E-2 shown above: 0.16 parts by mass, |
| •Surfactant F-2 shown above: 0.04 parts by mass |
| •Cyclopentanone: 78.14 parts by mass |
| Benzyl alcohol: 8.69 parts by mass |

-continued

| Composition of composition P2 for forming light absorption anisotropic layer |
| --- |
| Dichroic substance D-4 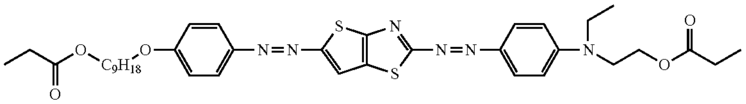 |
| Polymer liquid crystal compound P-2 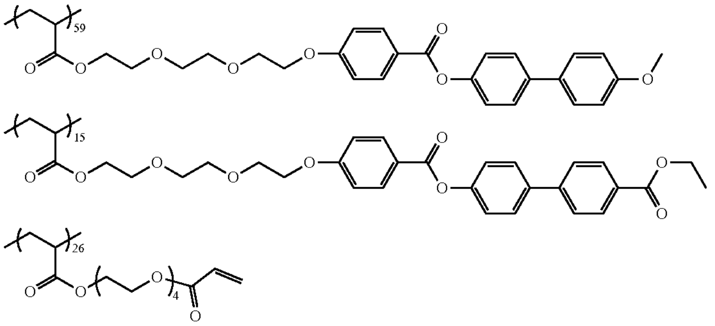 |

<Formation of Light Absorption Anisotropic Layer P3>

A light absorption anisotropic layer P3 was prepared by changing only the composition P1 for forming a light absorption anisotropic layer to the following composition P3 for forming a light absorption anisotropic layer and coating the light absorption anisotropic layer P1 with the composition.

The film thickness of the light absorption anisotropic layer P3 was 3 m, and the degree of alignment thereof was 0.96. The angle between the transmittance central axis of the light absorption anisotropic layer P3 and the film normal line was 0 degrees. The light absorption anisotropic layer P3 with a support obtained above was used as a first polarizer 10C.

| Composition of composition P3 for forming light absorption anisotropic layer |
| --- |
| Dichroic substance D-1 shown below: 0.97 parts by mass |
| Dichroic substance D-2 shown below: 0.08 parts by mass |
| Dichroic substance D-4 shown below: 1.13 parts by mass |
| Polymer liquid crystal compound P-2 shown above: 6.40 parts by mass |
| Low-molecular-weight liquid crystal compound M-1 shown above: 4.06 parts by mass |
| Polymerization initiator |
| IRGACURE OXE-02 (manufactured by BASF SE): 0.20 parts by mass |
| Compound E-1 shown above: 0.16 parts by mass |
| Compound E-2 shown above: 0.16 parts by mass, |
| Surfactant F-2 shown above: 0.04 parts by mass |
| Cyclopentanone: 78.14 parts by mass |
| Benzyl alcohol: 8.69 parts by mass |

[Preparation of Retardation Layer]

Various retardation layers used in the examples of the present invention were prepared as follows.

<Preparation of Retardation Layer of Example 1>

(Extrusion Molding)

A cycloolefin resin ARTON G7810 (manufactured by JSR Corporation) was dried at 100° C. for 2 hours or longer and melt-extruded at 280° C. using a twin screw kneading extruder. Here, a screen filter, a gear pump, and a leaf disc filter were disposed in this order between the extruder and the die, these were connected by a melt pipe, and the resultant was extruded from a T die having a width of 1000 mm and a lip gap of 1 mm and was cast on a triple cast roll whose temperature was set to 180° C., 175° C., and 170° C., thereby obtaining an unstretched film 1 having a width of 900 mm and a thickness of 320 m.

(Stretching/Thermal Fixation)

The unstretched film 1 being transported was subjected to a stretching step and a thermal fixing step by the following method.

(a) Machine-Direction Stretching

The unstretched film 1 was machine-directionally stretched under the following conditions while being transported using an inter-roll machine-direction stretching machine having an aspect ratio (L/W) of 0.2.

<Conditions>

Preheating temperature: 170° C.

Stretching temperature: 170° C.

Stretching ratio: 155%

(b) Cross-Direction Stretching

The machine-directionally stretched film was cross-directionally stretched under the following conditions while being transported using a tenter.

<Conditions>

Preheating temperature: 170° C.

Stretching temperature: 170° C.

Stretching ratio: 80%

(c) Thermal Fixation

After the stretching step, the stretched film was subjected to a heat treatment under the following conditions while end portions of the stretched film were gripped with a tenter clip to hold both end portions of the stretched film such that the width thereof was constant (within 3% of expansion or contraction), and the stretched film was thermally fixed.

Thermal fixation temperature: 165° C.

Thermal fixation time: 30 seconds

Further, the preheating temperature, the stretching temperature, and the thermal fixation temperature are average values of values measured at five points in the width direction using a radiation thermometer.

(Winding)

After the thermal fixation, both ends of the stretched film were trimmed and wound at a tension of 25 kg/m, thereby obtaining a film roll having a width of 1340 mm and a winding length of 2000 m.

The Re of the obtained stretched film was 170 nm, the Rth thereof was 510 nm, the Nz coefficient thereof was 3.5, the slow axis was in the MD direction, and the film thickness thereof was 68 μm. The obtained film was set as a B-plate 301 and used as the retardation layer of Example 1.

<Preparation of Retardation Layer of Example 2>

A stretched film having an Re of 100 nm, an Rth of 200 nm, and an Nz coefficient of 2.5 was obtained by adjusting the film thickness and the stretching ratio using the same method as that for the B-plate 301. The obtained film was set as a B-plate 301B and used as the retardation layer of Example 2.

<Preparation of Retardation Layer of Example 3>

(Extrusion Molding)

A polystyrene resin PSJ-polystyrene G9504 (manufactured by PS Japan Corporation) was dried at 100° C. for 2 hours or longer and melt-extruded at 280° C. using a twin screw kneading extruder. Here, a screen filter, a gear pump, and a leaf disc filter were disposed in this order between the extruder and the die, these were connected by a melt pipe, and the resultant was extruded from a T die having a width of 1000 mm and a lip gap of 1 mm and was cast on a triple cast roll whose temperature was set to 115° C., 110° C., and 105° C., thereby obtaining an unstretched film 2 having a width of 900 mm and a thickness of 500 m.

(Stretching/Thermal Fixation)

The unstretched film 2 being transported was subjected to a stretching step and a thermal fixing step by the following method.

(a) Machine-Direction Stretching

The unstretched film 2 was machine-directionally stretched under the following conditions while being transported using an inter-roll machine-directional stretching machine having an aspect ratio (L/W) of 0.2.

<Conditions>

Preheating temperature: 105° C.

Stretching temperature: 105° C.

Stretching ratio: 215%

(b) Cross-Direction Stretching

The machine-directionally stretched film was cross-directionally stretched under the following conditions while being transported using a tenter.

<Conditions>

Preheating temperature: 105° C.

Stretching temperature: 105° C.

Stretching ratio: 135%

(c) Thermal Fixation

After the stretching step, the stretched film was subjected to a heat treatment under the following conditions while end portions of the stretched film were gripped with a tenter clip to hold both end portions of the stretched film such that the width thereof was constant (within 3% of expansion or contraction), and the stretched film was thermally fixed.

Thermal fixation temperature: 100° C.

Thermal fixation time: 30 seconds

Further, the preheating temperature, the stretching temperature, and the thermal fixation temperature are average values of values measured at five points in the width direction using a radiation thermometer.

(Winding)

After the thermal fixation, both ends of the stretched film were trimmed and wound at a tension of 25 kg/m, thereby obtaining a film roll having a width of 1340 mm and a winding length of 2000 in.

The Re of the obtained stretched film was 170 nm, the Rth thereof was −510 nm, the slow axis was in the TD direction, the Nz coefficient thereof was −2.5, and the film thickness thereof was 70 μm. The obtained film was set as a B-plate 302 and used as the retardation layer of Example 3.

<Preparation of Retardation Layer of Example 4>

<Preparation of positive A-plate>

(Preparation of Photo-Alignment Film)

A coating solution 1 for a photo-alignment film was prepared with reference to the description of Example 3 of JP2012-155308A.

One surface of a cellulose acetate film "Z-TAC" (manufactured by FUJIFILM Corporation) was coated with the coating solution 1 for a photo-alignment film which had been prepared in advance, using a bar coater. The surface thereof was coated with the coating solution and dried on a hot plate at 120° C. for 2 minutes to remove the solvent, thereby forming a coating film. The obtained coating film was irradiated with polarized ultraviolet rays (10 $mJ/cm^2$, using an ultra-high pressure mercury lamp) to form a photo-alignment film 1.

(Formation of Retardation Layer Containing Rod-Like Liquid Crystal Compound)

A composition 1 for forming a liquid crystal layer with the following composition was prepared.

The photo-alignment film 1 was coated with the composition 1 for forming a liquid crystal layer using a bar coater to form a composition layer. The formed composition layer was heated to 110° C. on a hot plate and cooled to 60° C. so that the alignment was stabilized. Thereafter, the temperature was maintained at 60° C., the alignment was fixed by irradiating the layer with ultraviolet rays (500 $mJ/cm^2$, using an ultra-high pressure mercury lamp) under a nitrogen atmosphere (oxygen concentration of 100 ppm), thereby preparing a retardation layer with a thickness of 1.5 μm. The obtained retardation layer was a positive A-plate, and the Re (550) thereof was 120 nm.

The obtained optically anisotropic layer was set as a positive A-plate 401.

| (Composition 1 for forming liquid crystal layer) |
| --- |
| •Liquid crystal compound R1: 84.00 parts by mass |
| Polymerizable compound B2: 16.00 parts by mass |
| Polymerization initiator P3: 0.50 parts by mass |
| •Surfactant S3: 0.15 parts by mass |
| •HISOLVE MTEM (manufactured by Toho Chemical Industry Co., Ltd.): 2.00 parts by mass |
| •NK ESTER A-200 (manufactured by Shin-Nakamura Chemical Co., Ltd.): 1.00 parts by mass |
| •Methyl ethyl ketone: 424.8 parts by mass |

Liquid crystal compound R1

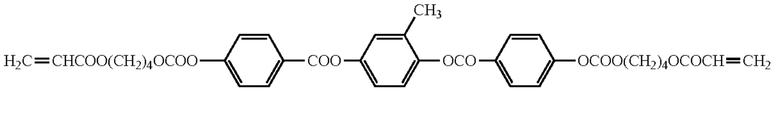

-continued

| (Composition 1 for forming liquid crystal layer) |
| --- |

Polymerizable compound B2

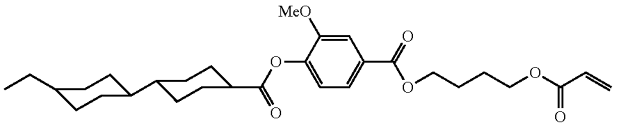 [SMILES: C=CC(=O)OCCCCOC(=O)c1ccc(OC(=O)C2CCC(C3CCC(CC)CC3)CC2)c(OC)c1]

Polymerization initiator P3

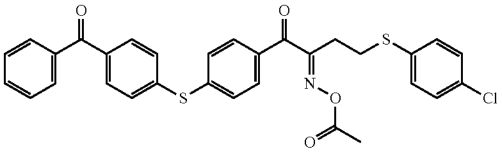 [SMILES: CC(=O)O/N=C(\CCSc1ccc(Cl)cc1)C(=O)c1ccc(Sc2ccc(C(=O)c3ccccc3)cc2)cc1]

Surfactant S3

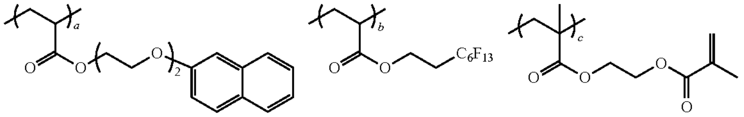

<Preparation of Positive C-Plate>

The surface of the positive A-plate 401 prepared above on the coating side was subjected to a corona treatment with a discharge amount of 150 W-min/$m^2$, and a positive C-plate 402 was prepared on the positive A-plate 303 using the following composition 2 for forming a liquid crystal layer in the same manner as described above.

The Re (550) of the positive C-plate 402 was 0.2 nm and the Rth (550) thereof was −420 nm.

The laminate of the positive A-plate 401 and the positive C-plate 402 obtained above was used as a retardation layer 303 of Example 4.

| (Composition 2 for forming liquid crystal layer) |
| --- |
| Liquid crystal compound R4: 100.0 parts by mass |
| Compound B1: 1.5 parts by mass |
| Monomer K1: 4.0 parts by mass |
| Polymerization initiator P1: 5.0 parts by mass |
| Polymerization initiator P2: 2.0 parts by mass |
| Surfactant S1: 0.4 parts by mass |
| Surfactant S2: 0.5 parts by mass |
| Acetone: 200.0 parts by mass |
| Propylene glycol monomethyl ether acetate: 50.0 parts by mass |

Liquid crystal compound R4

Mixture of liquid crystal compounds (RA), (RB), and (RC) shown below at mass ratio of 83:15:2

(RA)

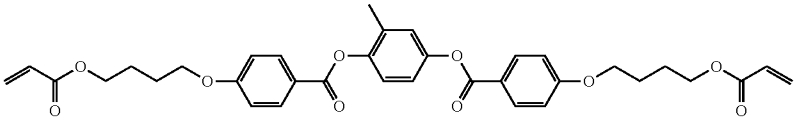

(RB)

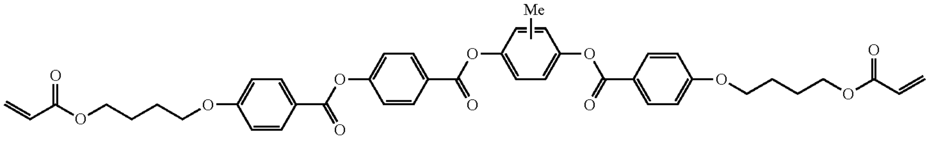

(RC)

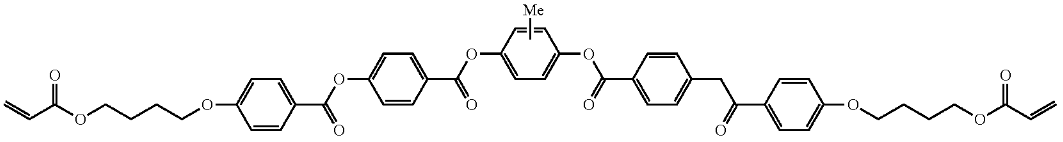

Compound B1

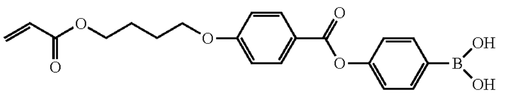 [SMILES: C=CC(=O)OCCCCOc1ccc(C(=O)Oc2ccc(B(O)O)cc2)cc1]

Monomer K1: A-TMMT (manufactured by Shin-Nakamura Chemical Co., Ltd.)

-continued

| (Composition 2 for forming liquid crystal layer) |
| --- |

Polymerization initiator P1

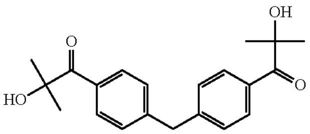 [SMILES: CC(C)(O)C(=O)c1ccc(Cc2ccc(C(=O)C(C)(C)O)cc2)cc1]

Polymerization initiator P2

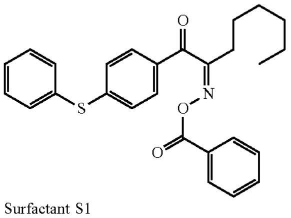

Surfactant S1

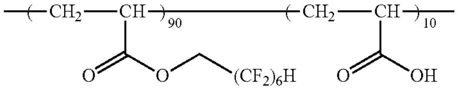

Mw: 15 k
The numerical values in the structure are in units of % by mass
Surfactant S2 (weight-average molecular weight: 11,200)

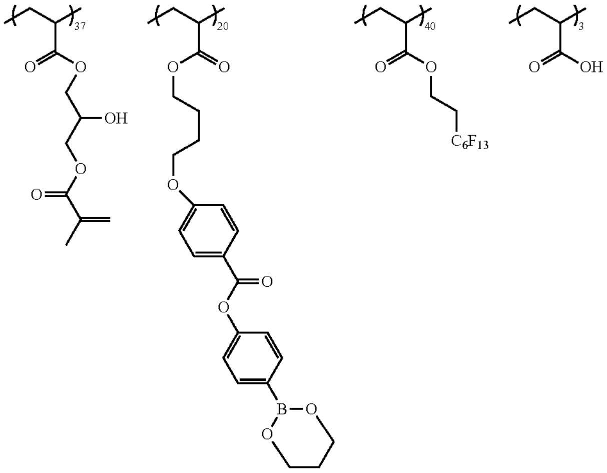

<Preparation of Retardation Layer of Example 5>

<Preparation of Positive A-Plate Having Reverse Wavelength Dispersibility>

A positive A-plate 401B having reverse wavelength dispersibility was obtained in the same manner as that for the positive A-plate 401 except that the composition 3 for forming a liquid crystal layer with the following composition was used.

The positive A-plate 401B was a positive A-plate having reverse wavelength dispersibility, and the Re (550) thereof was 120 nm and Re (450)/Re (550) was 0.86.

| (Composition 3 for forming liquid crystal layer) |
| --- |
| •Liquid crystal compound R2: 42.00 parts by mass |
| •Liquid crystal compound R3: 42.00 parts by mass |
| Polymerizable compound B2: 16.00 parts by mass |
| •Polymerization initiator P3: 0.50 parts by mass |
| •Surfactant S3: 0.15 parts by mass |
| •HISOLVE MTEM (manufactured by Toho Chemical Industry Co., Ltd.): 2.00 parts by mass |
| •NK ESTER A-200 (manufactured by Shin-Nakamura Chemical Co., Ltd.): 1.00 parts by mass |
| Methyl ethyl ketone: 424.8 parts by mass |

-continued

| (Composition 3 for forming liquid crystal layer) |
| --- |

Liquid crystal compound R2

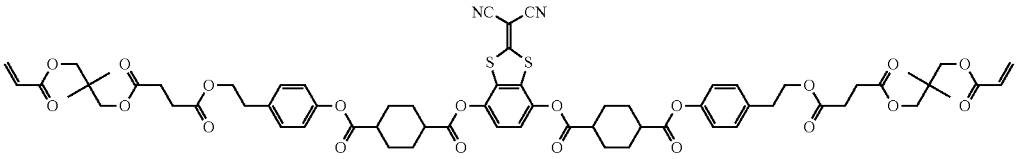 [SMILES: C=CC(=O)OCC(C)(C)COC(=O)CCC(=O)OCCc1ccc(OC(=O)C2CCC(C(=O)Oc3ccc(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Liquid crystal compound R3

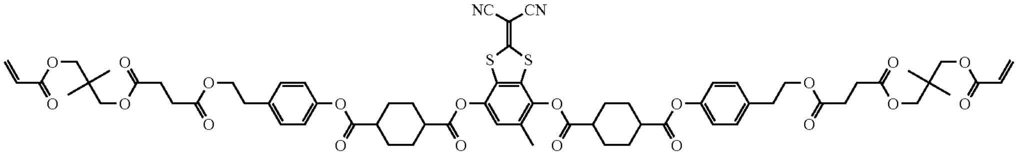 [SMILES: C=CC(=O)OCC(C)(C)COC(=O)CCC(=O)OCCc1ccc(OC(=O)C2CCC(C(=O)Oc3cc(C)c(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

<Preparation of Positive C-Plate Having Reverse Wavelength Dispersibility>

A positive C-plate 402B having reverse wavelength dispersibility was obtained in the same manner as that for the positive C-plate 402 except that the positive C-plate 402B was formed on the positive A-plate 401B using the composition 4 for forming a liquid crystal layer with the following composition.

The positive C-plate 402B was a positive C-plate having reverse wavelength dispersibility, and the Re (550) thereof was 0.2 nm, the Rth (550) was −420 nm, and Rth (450)/Rth (550) was 0.95.

The laminate of the positive A-plate 401B and the positive C-plate 402B obtained above was used as a retardation layer 303B of Example 5.

| (Composition 4 for forming liquid crystal layer) |
| --- |
| Liquid crystal compound R4: 50.0 parts by mass |
| Liquid crystal compound R2: 33.3 parts by mass |
| Liquid crystal compound R3: 16.7 parts by mass |
| Compound B1: 1.5 parts by mass |
| Monomer K1: 4.0 parts by mass |
| Polymerization initiator P1: 5.0 parts by mass |

-continued

| (Composition 4 for forming liquid crystal layer) |
| --- |
| Polymerization initiator P2: 2.0 parts by mass |
| Surfactant S1: 0.4 parts by mass |
| Surfactant S2: 0.5 parts by mass |
| Acetone: 200.0 parts by mass |
| Propylene glycol monomethyl ether acetate: 50.0 parts by mass |

<Preparation of Retardation Layer of Example 6>

<Preparation of Negative A-Plate>

The alignment film PAL used for preparing the first polarizer described above was subjected to a rubbing treatment.

The alignment film prepared above was coated with the following composition 5 for forming a liquid crystal layer containing a disk-like liquid crystal compound with the following composition, using a wire bar. Next, the film was heated with hot air at 120° C. for 90 seconds for drying the solvent of the coating solution and alignment aging of the disk-like liquid crystal compound. Subsequently, the alignment of the liquid crystal compound was fixed by performing UV irradiation at 80° C. In this manner, a negative A-plate 403 was obtained. The Re (550) of the negative A-plate 403 was 120 nm.

| (Composition 5 for forming liquid crystal layer) |
| --- |
| •Disk-like (discotic) liquid crystal compound shown below: 91 parts by mass |
| •Acrylate monomer shown below: 5 parts by mass |
| •Photopolymerization initiator (IRGACURE 907, manufactured by Ciba-Geigy AG): 3 parts by mass |
| •Sensitizer (KAYACURE DETX, manufactured by Nippon Kayaku Co., Ltd.): 1 part by mass |
| •Pyridinium salt shown below: 0.5 parts by mass |
| •Fluorine-based polymer (FP1) shown below: 0.2 parts by mass |
| •Fluorine-based polymer (FP3) shown below: 0.1 parts by mass |
| •Methyl ethyl ketone: 189 parts by mass |

Discotic liquid crystal compound

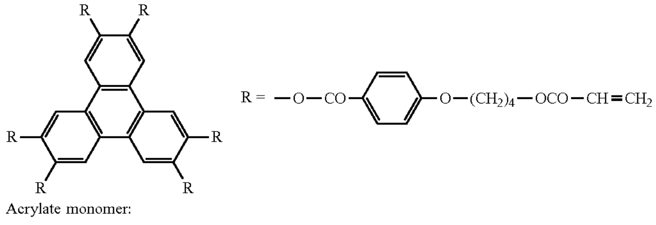

Acrylate monomer:

Ethylene oxide-modified trimethylolpropane triacrylate (V #360, manufactured by Osaka Organic Chemical Industry Ltd.)

-continued

| (Composition 5 for forming liquid crystal layer) |
| --- |

Pyridinium salt

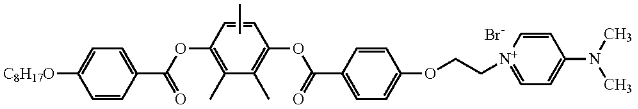

Fluorine-based polymer (FP1)

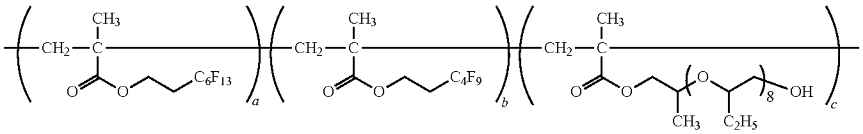

a/b/c = 20/20/60 wt %

Mw = 16000

Fluorine-based polymer (FP3)

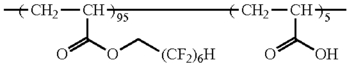

Mw = 17000

<Preparation of Negative C-Plate>

The surface of the negative A-plate 403 prepared above on the coating side was subjected to a corona treatment with a discharge amount of 150 W·min/$m^2$, and a negative C-plate 404 was prepared on the negative A-plate 403 using the following composition 6 for forming a liquid crystal layer in the same manner as described above.

The Re (550) of the negative C-plate 404 was 0.2 nm and the Rth (550) thereof was 400 nm.

The laminate of the negative A-plate 403 and the negative C-plate 404 obtained above was used as a retardation layer 305 of Example 6.

| (Composition 6 for forming liquid crystal layer) |
| --- |
| Discotic liquid crystal compound A-1: 80 parts by mass |
| Discotic liquid crystal compound A-2: 20 parts by mass |
| Discotic liquid crystal compound B-1: 5.6 parts by mass |
| Polymerizable monomer T-1: 5.6 parts by mass |
| Polymer C-1: 0.2 parts by mass |
| Polymerization initiator (IRGACURE 907, manufactured by BASF SE): 3 parts by mass |
| Toluene: 170 parts by mass |
| Methyl ethyl ketone: 73 parts by mass |

Discotic liquid crystal compound A-1 (1,3,5-substituted benzene type polymerizable discotic liquid crystal compound)

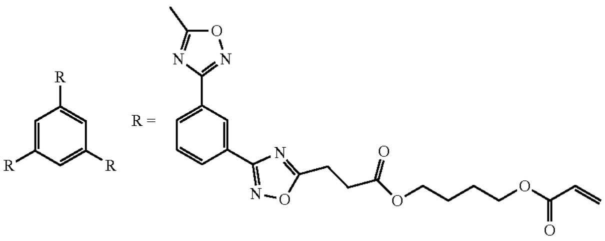

Discotic liquid crystal compound A-2 (1,3,5-substituted benzene type polymerizable discotic liquid crystal compound)

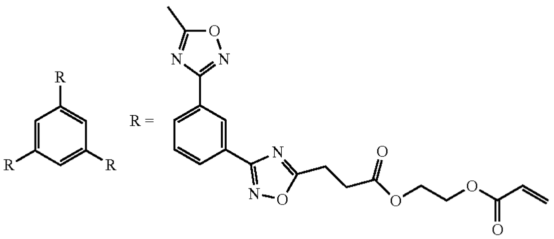

-continued (Composition 6 for forming liquid crystal layer)

Discotic liquid crystal compound B-1 (polymerizable triphenylene type discotic liquid crystal compound)

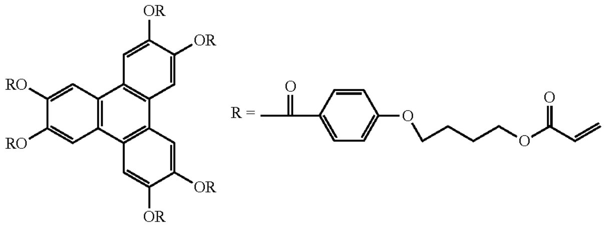

Polymerizable monomer T-1

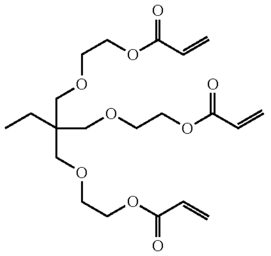 [SMILES: C=CC(=O)OCCOCC(CC)(COCCOC(=O)C=C)COCCOC(=O)C=C]

Polymer C-1 (hereinafter, the copolymerization ratio of the chemical structural formula is in units of % by mass).

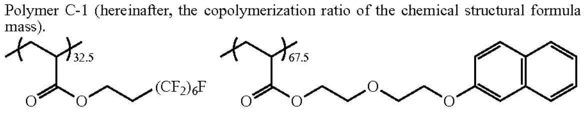

<Preparation of Retardation Layer of Example 7>

<Preparation of B-Plate>

A stretched film having an Re of 120 nm, an Rth of 120 nm, and an Nz coefficient of 1.5 was obtained by adjusting the film thickness and the stretching ratio using the same method as that for the B-plate 301. The obtained film was set as a B-plate 405.

<Preparation of Positive C-Plate>

A positive C-plate 406 having an Re of 0.2 nm and an Rth of −450 nm was prepared on the B-plate 405 prepared above by adjusting the film thickness using the same method as that for the positive C-plate 402.

The laminate of the B-plate 405 and the positive C-plate 406 obtained above was used as a retardation layer 307 of Example 7.

<Preparation of Retardation Layer of Example 8>

<Preparation of Negative C-Plate>

A negative C-plate 408 having an Re of 0.2 nm and an Rth of 250 nm was prepared on the B-plate 405 by adjusting the film thickness using the same method as that for the negative C-plate 404.

The laminate of the B-plate 405 and the negative C-plate 408 obtained above was used as a retardation layer 309 of Example 8.

<Preparation of Retardation Layer of Example 9>

<Preparation of B-Plate>

A stretched film having an Re of 120 nm, an Rth of 420 nm, and an Nz coefficient of 4.0 was obtained by adjusting the film thickness and the stretching ratio using the same method as that for the B-plate 301. The obtained film was set as a B-plate 301C.

<Preparation of Retardation Layer of Example 10>

<Preparation of B-Plate>

A stretched film having an Re of 160 nm, an Rth of 400 nm, and an Nz coefficient of 3.0 was obtained by adjusting the film thickness and the stretching ratio using the same method as that for the B-plate 301. The obtained film was set as a B-plate 301D.

[Preparation of Viewing Angle Control Polarizing Plate]

The various first polarizers and the various retardation layers prepared above were appropriately bonded to each other using a commercially available pressure sensitive adhesive SK2057 (manufactured by Soken Chemical & Engineering Co., Ltd.), thereby preparing a viewing angle control polarizing plate. The thickness of SK2057 was approximately 20 m.

The configurations of the prepared viewing angle control polarizing plates in the examples are listed in Table 1.

[Preparation of Viewing Angle Control Systems of Examples 1 to 10]

The various viewing angle control polarizing plates prepared above were bonded onto a viewing-side polarizing plate of the liquid crystal display device of dynabook (manufactured by Toshiba Corporation), which is a notebook computer equipped with a liquid crystal display device, using a pressure sensitive adhesive SK2057. Further, in the viewing-side polarizing plate of dynabook, the azimuth of the absorption axis was in the longitudinal direction. In this manner, a viewing angle control system having the viewing-side polarizing plate of dynabook as the second polarizer was prepared.

The summary of the prepared viewing angle control systems of Examples 1 to 10 is listed in Table 1.

Further, various retardation layers described above were used as the retardation layers, and the orientation of the bonding of the viewing angle control polarizing plate was adjusted such that the orientation of the slow axis of each retardation layer was set as listed in Table 1. Here, the orientation of the slow axis was represented by an azimuthal angle in which the azimuth of the absorption axis of the viewing-side polarizing plate of dynabook was set to 0°.

[Preparation of Viewing Angle Control System of Comparative Example 1]

A viewing angle control system of Comparative Example 1 was prepared in the same manner as in Examples 1 to 10 except that a louver film "PF14 H2" (manufactured by 3M Company) was used in place of the viewing angle control polarizing plate described above. The louver film was disposed such that the direction of the louver was in the longitudinal direction (in a direction in which the azimuthal angle was 0°).

[Preparation of Viewing Angle Control System of Comparative Example 2]

A viewing angle control system of Comparative Example 2 which did not have a retardation layer was prepared in the same manner as in Examples 1 to 10 except that only the first polarizer 10 was used in place of the viewing angle control polarizing plate described above.

The summary of the prepared viewing angle control system of Comparative Example 2 is listed in Table 1.

[Preparation of Viewing Angle Control System of Comparative Example 3]

A viewing angle control system of Comparative Example 3 was prepared in the same manner as in Examples 1 to 10 except that a cellulose acylate film TG40 (TAC base material having a thickness of 40 μm; manufactured by FUJIFILM Corporation) was used in place of the retardation layer described above.

Further, the Re of the cellulose acylate film TG40 was 1.6 nm and the Rth thereof was 26 nm.

The summary of the prepared viewing angle control system of Comparative Example 3 is listed in Table 1.

(Evaluation of Oblique Light Shielding Performance of Viewing Angle Control System)

All the prepared viewing angle control systems of the examples and the comparative examples exhibited light shielding performance as observed in the lateral direction of the screen.

The viewing angle characteristics of the viewing angle control systems were measured using a viewing angle characteristic evaluation device EZContrast (manufactured by ELDIM). Further, the liquid crystal display device of dynabook displayed the entire screen in white during the measurement.

The values of the brightness of the front surface (polar angle of 0°) and the brightness at an azimuthal angle of 45° and a polar angle of 60° were extracted based on the data of the obtained brightness and respectively used as the front brightness and the oblique brightness. Next, the oblique brightness/front brightness was calculated and used as the standard for the oblique light shielding performance.

Further, in a case where the oblique brightness/front brightness was 5% or less, the light shielding performance at an azimuthal angle of 45° and a polar angle of 60° was satisfactory, and the displayed contents were difficult to read in a case of observation in this direction. Further, in a case where the oblique brightness/front brightness was 1% or less, the light shielding performance at an azimuthal angle of 45° and a polar angle of 60° was highly satisfactory.

The oblique light shielding performances of the viewing angle control systems of the examples and the comparative examples are listed in Table 1. As listed in Table 1, the viewing angle control system of the present invention had more satisfactory oblique light shielding performance as compared with the oblique light shielding performances of Comparative Example 2 and Comparative Example 3.

(Evaluation of Moire of Viewing Angle Control System)

Each of the prepared viewing angle control polarizing plates was bonded onto a liquid crystal display device of a smartphone iPhone 8 Plus (registered trademark, manufactured by Apple Inc.), and moire was evaluated.

Further, the iPhone 8 Plus (registered trademark) was a smartphone equipped with a high-definition liquid crystal display device, and the pixel density of the liquid crystal display device was 401 ppi. A black and white stripe pattern in which black and white were alternatingly disposed for each pixel in the machine direction was displayed on the liquid crystal display device, the black and white stripe pattern was observed from the front, and the moire was visually evaluated.

The results are listed in Table 2. As listed in Table 2, moire was visually recognized in the louver film, but moire was not visually recognized from any of the viewing angle control polarizing plates of the present invention. Therefore, the viewing angle control polarizing plates of the present invention had excellent display performance on the front surfaces.

TABLE 1

| | Configuration of viewing angle control polarizing plate | | | | | | | | |
|---|---|---|---|---|---|---|---|---|---|
| | | Retardation layer | | | | | | | |
| | | Optically anisotropic layer on side of first polarizer | | | | | | | |
| | First polarizer | Type | Re (nm) | Rth (nm) | Nz coefficient | Azimuth of slow axis | Wavelength dispersion | Optically anisotropic layer on side of second polarizer Type |
| Example 1 | First polarizer 10 | B-plate 301 | 170 | 510 | 3.5 | 0° | Forward dispersion | Not available |
| Example 2 | First polarizer 10 | B-plate 301B | 100 | 200 | 2.5 | 0° | Forward dispersion | Not available |
| Example 3 | First polarizer 10 | B-plate 302 | 170 | −510 | −2.5 | 90° | Forward dispersion | Not available |
| Example 4 | First polarizer 10 | Positive A-plate 401 | 120 | 60 | 1.0 | 90° | Forward dispersion | Positive C-plate 402 |
| Example 5 | First polarizer 10 | Positive A-plate 401B | 120 | 60 | 1.0 | 90° | Reverse dispersion | Positive C-plate 402B |
| Example 6 | First polarizer 10 | Negative A-plate 403 | 120 | −60 | 0.0 | 0° | Forward dispersion | Negative C-plate 404 |
| Example 7 | First polarizer 10 | B-plate 405 | 120 | 120 | 1.5 | 90° | Forward dispersion | Positive C-plate 406 |
| Example 8 | First polarizer 10 | B-plate 405 | 120 | 120 | 1.5 | 0° | Forward dispersion | Negative C-plate 408 |
| Example 9 | First polarizer 10B | B-plate 301C | 120 | 420 | 4.0 | 0° | Forward dispersion | Not available |

TABLE 1-continued

| | | | | | | | | |
|---|---|---|---|---|---|---|---|---|
| Example 10 | First polarizer 10C | B-plate 301D | 160 | 400 | 3.0 | 0° | Forward dispersion | Not available |
| Comparative example 1 | Not available (louver film) | Not available | — | — | — | — | — | Not available |
| Comparative example 2 | First polarizer 10 | Not available | — | — | — | — | — | Not available |
| Comparative example 3 | First polarizer 10 | TG40 | 1.6 | 26 | 16.8 | 0° | Forward dispersion | Not available |

| | Configuration of viewing angle control polarizing plate Retardation layer | | | | | | | | |
|---|---|---|---|---|---|---|---|---|---|
| | Optically anisotropic layer on side of second polarizer | | | | | | | | |
| | Re (nm) | Rth (nm) | Nz coefficient | Azimuth of slow axis | Wavelength dispersion | Thickness (μm) | Re (nm) | Rth (nm) | Nz |
| Example 1 | — | — | — | — | — | 132 | 170 | 510 | 3.5 |
| Example 2 | — | — | — | — | — | 104 | 100 | 200 | 2.5 |
| Example 3 | — | — | — | — | — | 134 | 170 | −510 | −2.5 |
| Example 4 | 0 | −420 | −∞ | — | Forward dispersion | 109 | 120 | −360 | −2.5 |
| Example 5 | 0 | −420 | −∞ | — | Reverse dispersion | 109 | 120 | −360 | −2.5 |
| Example 6 | 0 | 400 | ∞ | — | Forward dispersion | 109 | 120 | 340 | 3.3 |
| Example 7 | 0 | −450 | −∞ | — | Forward dispersion | 109 | 120 | −330 | −2.3 |
| Example 8 | 0 | 250 | ∞ | — | Forward dispersion | 109 | 120 | 370 | 3.7 |
| Example 9 | — | — | — | — | — | 110 | 120 | 420 | 4.0 |
| Example 10 | — | — | — | — | — | 108 | 160 | 400 | 3.0 |
| Comparative example 1 | — | — | — | — | — | 500 | — | — | — |
| Comparative example 2 | — | — | — | — | — | 44 | — | — | — |
| Comparative example 3 | — | — | — | — | — | 104 | 1.6 | 26 | 16.8 |

TABLE 2

| | Retardation layer | | | | Evaluation result | |
|---|---|---|---|---|---|---|
| | Thickness (μm) | Re (nm) | Rth (nm) | NZ | Oblique light shielding performance Oblique brightness/front brightness | Moire Visibility |
| Example 1 | 132 | 170 | 510 | 3.5 | 0.7% | Not visually recognized |
| Example 2 | 104 | 100 | 200 | 2.5 | 1.4% | Not visually recognized |
| Example 3 | 134 | 170 | −510 | −2.5 | 0.8% | Not visually recognized |
| Example 4 | 109 | 120 | −360 | −2.5 | 0.8% | Not visually recognized |
| Example 5 | 109 | 120 | −360 | −2.5 | 0.6% | Not visually recognized |
| Example 6 | 109 | 120 | 340 | 3.3 | 1.0% | Not visually recognized |
| Example 7 | 109 | 120 | −330 | −2.3 | 0.8% | Not visually recognized |
| Example 8 | 109 | 120 | 370 | 3.7 | 1.0% | Not visually recognized |
| Example 9 | 110 | 120 | 420 | 4.0 | 1.0% | Not visually recognized |
| Example 10 | 108 | 160 | 400 | 3.0 | 0.9% | Not visually recognized |
| Comparative example 1 | 500 | — | — | — | 0.7% | Visually recognized |
| Comparative example 2 | 44 | — | — | — | 9.0% | Not visually recognized |

TABLE 2-continued

| | Retardation layer | | | | Evaluation result | |
|---|---|---|---|---|---|---|
| | | | | | Oblique light shielding performance Oblique | |
| | Thickness (μm) | Re (nm) | Rth (nm) | NZ | brightness/front brightness | Moire Visibility |
| Comparative example 3 | 104 | 1.6 | 26 | 16.8 | 9.0% | Not visually recognized |

As listed in Table 1, the viewing angle control system of the present invention had satisfactory oblique light shielding performance and satisfactory display performance on the front surface without occurrence of moire.

Further, all the viewing angle control polarizing plates of the present invention had a thickness of 150 μm or less and were easy to bend. Further, the louver film used in Comparative Example 1 had a thickness of 500 μm and was difficult to bend. Further, in a case where a bending test was performed on the viewing angle control polarizing plates of the examples and the comparative examples using a mandrel having a diameter of 10 mm, the viewing angle control polarizing plates of Examples 1 to 10 and Comparative Examples 2 and 3 were not broken or deformed. Meanwhile, in the louver film of Comparative Example 1, a trace of deformation remained in the bent portion. In addition, the louver film was partially damaged.

[Preparation of First Polarizer 10D with Inclined Absorption Axis]

<Preparation of Transparent Support 1>

The surface of a cellulose acylate film 1 (TAC base material with a thickness of 40 μm; TG40, manufactured by FUJIFILM Corporation) was saponified with an alkaline solution and coated with the following coating solution 1 for forming an alignment layer using a wire bar. The support on which the coating film had been formed was dried with hot air at 60° C. for 60 seconds and further dried with hot air at 100° C. for 120 seconds to form an alignment layer 1, thereby obtaining a TAC film with an alignment layer.

The film thickness thereof was 0.5 μm.

Further, the prepared TAC film with an alignment layer was used by performing a rubbing treatment on the surface of the alignment film.

| (Coating solution 1 for forming alignment layer) |
|---|
| •Modified polyvinyl alcohol shown below: 3.80 parts by mass |
| Initiator Irg2959: 0.20 parts by mass |
| •Water: 70 parts by mass |
| Methanol: 30 parts by mass |

Modified polyvinyl alcohol

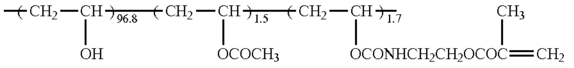

<Preparation of Liquid Crystal Layer for Alignment>

The alignment film of the prepared TAC film with an alignment layer was coated with the following composition T1 for forming a liquid crystal layer for alignment with the following composition using a wire bar, thereby preparing a coating layer T1.

Next, the coating layer T1 was heated at 120° C. for 30 seconds, and the coating layer T1 was cooled to room temperature (23° C.). Next, the coating layer was heated at 80° C. for 60 seconds and cooled to room temperature again.

Thereafter, the coating layer was irradiated with an LED lamp (center wavelength of 365 nm) for 1 second under an irradiation condition of an illuminance of 200 mW/cm$^2$, thereby preparing a liquid crystal layer T1 for alignment on the alignment layer 1.

The film thickness of the liquid crystal layer T1 for alignment was 0.42 μm.

| Composition of composition T1 for forming liquid crystal layer for alignment |
|---|
| Polymer liquid crystal compound P-2: 55.20 parts by mass |
| Low-molecular-weight liquid crystal compound M-1: 40.49 parts by mass |
| Polymerization initiator |
| IRGACURE OXE-02 (manufactured by BASF SE): 4.049 parts by mass |
| Surfactant F-2: 0.2620 parts by mass |
| Cyclopentanone: 660.6 parts by mass |
| Tetrahydrofuran: 660.6 parts by mass |

<Formation of Light Absorption Anisotropic Layer P4>

The obtained liquid crystal layer T1 for alignment was coated with the following composition P1 for forming a light absorption anisotropic layer using a wire bar, thereby forming a coating layer.

Next, the coating layer was heated at 120° C. for 30 seconds and cooled to room temperature (23° C.). Next, the coating layer was heated at 80° C. for 60 seconds and cooled to room temperature again.

Thereafter, the coating layer was irradiated with an LED lamp (center wavelength of 365 nm) for 1 second under an irradiation condition of an illuminance of 200 mW/cm$^2$, thereby preparing a light absorption anisotropic layer P4 on the alignment layer 1.

The film thickness of the light absorption anisotropic layer P4 was 1.5 μm. The light absorption anisotropic layer P4 with a support which had been obtained above was used as a first polarizer 10D.

| Composition of composition P4 for forming light absorption anisotropic layer |
|---|
| •Dichroic substance D-1: 7.356 parts by mass |
| •Dichroic substance D-2: 3.308 parts by mass |
| •Dichroic substance D-3: 11.02 parts by mass |
| Polymer liquid crystal compound P-2: 43.29 parts by mass |
| •Low-molecular-weight liquid crystal compound M-1: 31.75 parts by mass |
| •Polymerization initiator |
| IRGACURE OXE-02 (manufactured by BASF SE): 3.175 parts by mass |
| •Surfactant F-3: 0.1027 parts by mass |
| •Cyclopentanone: 514.4 parts by mass |
| •Tetrahydrofuran: 514.4 parts by mass |

-continued

| Composition of composition P4 for forming light absorption anisotropic layer |
|---|
| Surfactant F-3 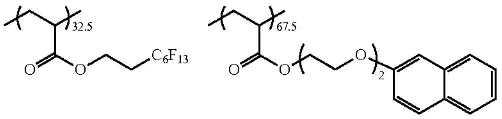 |

<Measurement of Alignment Angle of Light Absorption Anisotropic Layer>

The light absorption anisotropic layer P4 was disposed on a sample table in the horizontal direction using AxoScan OPMF-1 (manufactured by Opto Science Inc.), the transmittance was measured while the azimuthal angle at which P polarized light was incident on the film and the polar angle were variously changed, and the azimuthal angle and the polar angle of the transmittance central axis of the light absorption anisotropic layer P4 were examined.

Figure 17:
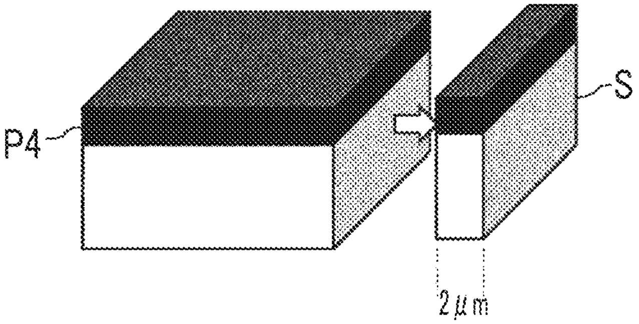
FIG. 17 is a view for describing a method of measuring an alignment angle.
Figure 18:
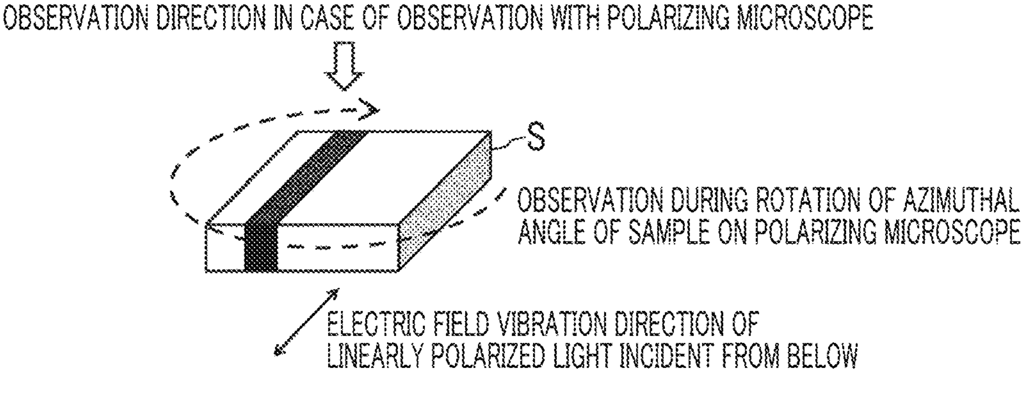
FIG. 18 is a view for describing a method of measuring an alignment angle.

Further, as illustrated in FIG. 17, a section S having a thickness of 2 μm was collected by a microtome in parallel with the plane including the transmittance central axis and the normal line of the film. The collected section S was placed such that the cross section thereof was parallel to a rotation table, and the azimuthal angle (the angle at which the section rotated) of the section, at which the cross section of the light absorption anisotropic layer was the most quenched with respect to linearly polarized light that was incident, on the rotation table of a polarizing microscope as illustrated in FIG. 18. The absorption axis direction of the light absorption anisotropic layer was at an angle of 700 from the surface of the support.

[Preparation of First Polarizer Layer 10E with Inclined Absorption Axis]

A light absorption anisotropic layer P5 was prepared in the same manner as that for the polarizer layer 10D except that the thickness of the liquid crystal layer for alignment was set to 0.75 m and the film thickness of the light absorption anisotropic layer was set to 1.3 m in the method of preparing the first polarizer layer 10D. The absorption axis direction of the light absorption anisotropic layer was at an angle of 80° from the surface of the support. The light absorption anisotropic layer P5 with the support which had been obtained above was used as a first polarizer 10E.

<Preparation of Retardation Layer of Example 11>

<Preparation of B-plate>

A stretched film having an Re of 225 nm, an Rth of 300 nm, and an Nz coefficient of 1.8 was obtained by adjusting the film thickness and the stretching ratio using the same method as that for the B-plate 301. The obtained film was set as a B-plate 310.

<Preparation of Retardation Layer of Example 12>

<Preparation of B-plate>

A stretched film having an Re of 200 nm, an Rth of 375 nm, and an Nz coefficient of 2.4 was obtained by adjusting the film thickness and the stretching ratio using the same method as that for the B-plate 301. The obtained film was set as a B-plate 311.

[Preparation of Viewing Angle Control Polarizing Plate]

The first polarizers and the various retardation layers prepared above were appropriately bonded to each other using a commercially available pressure sensitive adhesive SK2057 (manufactured by Soken Chemical & Engineering Co., Ltd.), thereby preparing a viewing angle control polarizing plate. The thickness of SK2057 was approximately 20 μm. The configurations of the prepared viewing angle control polarizing plates in the examples are listed in Table 3.

[Preparation of Viewing Angle Control Systems of Examples 11 and 12]

The various viewing angle control polarizing plates prepared above were bonded onto a viewing-side polarizing plate of the liquid crystal display device using a pressure sensitive adhesive SK2057 in the same manner as in Examples 1 to 8. Here, the azimuthal angle of the absorption axis of the first polarizer and the orientation of the slow axis of the retardation layer were represented by an azimuthal angle in which the azimuth of the absorption axis of the viewing-side polarizing plate of dynabook was set to 0°.

[Preparation of Viewing Angle Control System of Comparative Example 4]

A viewing angle control system of Comparative Example 4 which did not have a retardation layer was prepared in the same manner as in Examples 11 and 12 except that only the first polarizer 10D was used in place of the above-described viewing angle control polarizing plate.

(Evaluation of Oblique Light Shielding Performance of Viewing Angle Control System)

All the viewing angle control systems of Examples 11 and 12 and Comparative Example 4 prepared above exhibited the performance of being bright as observed in the left direction (direction at which the azimuthal angle was 90°) of the screen and the performance of shielding light as observed in the right direction.

The viewing angle characteristics of the viewing angle control systems were measured using a viewing angle characteristic evaluation device EZContrast (manufactured by ELDIM). Further, the liquid crystal display device of dynabook displayed the entire screen in white during the measurement.

The maximum brightness values and the values of the brightness at an azimuthal angle of −45° and a polar angle of 60° were extracted based on the data of the obtained brightness and respectively used as the maximum brightness and the oblique brightness. Next, the oblique brightness/maximum brightness was calculated and used as the standard for the oblique light shielding performance.

Further, in a case where the oblique brightness/front brightness was 5% or less, the light shielding performance at an azimuthal angle of −45° and a polar angle of 60° was satisfactory, and the displayed contents were difficult to read in a case of observation in this direction (evaluation B). Further, in a case where the oblique brightness/front brightness was 1% or less, the light shielding performance at an azimuthal angle of −45° and a polar angle of 60° was highly satisfactory (evaluation A). Further, in a case where the oblique brightness/front brightness was greater than 5%, the light shielding performance at an azimuthal angle of −45° and a polar angle of 60° was not satisfactory (evaluation C).

The oblique light shielding performances of the viewing angle control systems of the examples and the comparative examples are listed in Table 3. As listed in Table 3, the viewing angle control system of the present invention had more satisfactory oblique light shielding performance as compared with the oblique light shielding performance of Comparative Example 4.

(Evaluation of Moire of Viewing Angle Control System)

Each of the prepared viewing angle control polarizing plates was bonded onto a liquid crystal display device of a smartphone iPhone 8 Plus (registered trademark, manufactured by Apple Inc.), and moire was evaluated.

Further, the iPhone 8 Plus (registered trademark) was a smartphone equipped with a high-definition liquid crystal display device, and the pixel density of the liquid crystal display device was 401 ppi. A black and white stripe pattern in which black and white were alternatingly disposed for each pixel in the machine direction was displayed on the liquid crystal display device, the black and white stripe pattern was observed from the front, and the moire was visually evaluated.

The results are listed in Table 3. As listed in Table 3, moire was not visually recognized from any of the viewing angle control polarizing plates of the present invention, and the viewing angle control polarizing plates had satisfactory display performance on the front surface.

Further, all the viewing angle control polarizing plates of the present invention had a thickness of 150 m or less and were easy to bend. Further, in a case where a bending test was performed on the viewing angle control polarizing plates of Examples 11 and 12 and Comparative Example 4 using a mandrel having a diameter of 10 mm, the viewing angle control polarizing plates were not broken or deformed.

101 to 109: viewing angle control system
301, 302: retardation layer consisting of B-plate
303 to 313: retardation layer
401: optically anisotropic layer consisting of positive A-plate
402: optically anisotropic layer consisting of positive C-plate
403: optically anisotropic layer consisting of negative A-plate
404: optically anisotropic layer consisting of negative C-plate
405: optically anisotropic layer consisting of B-plate
406: optically anisotropic layer consisting of positive C-plate
407: optically anisotropic layer consisting of B-plate
408: optically anisotropic layer consisting of negative C-plate
409: optically anisotropic layer consisting of B-plate

TABLE 3

| | Configuration of viewing angle control polarizing plate | | | | | | | |
|---|---|---|---|---|---|---|---|---|
| | First polarizer | | Retardation layer Optically anisotropic layer on side of first polarizer | | | | | |
| | Type | Absorption axis polar angle/azimuthal angle | Type | Re (nm) | Rth (nm) | Nz coefficient | Azimuth of slow axis | Wavelength dispersion |
| Example 11 | First polarizer 10D | 20°/270° | B-plate 310 | 225 | 300 | 1.8 | 0° | Forward dispersion |
| Example 12 | First polarizer 10E | 10°/270° | B-plate 311 | 200 | 375 | 2.4 | 0° | Forward dispersion |
| Comparative example 4 | First polarizer 10D | 20°/270° | Not available | — | — | — | — | — |

| | Configuration of viewing angle control polarizing plate Retardation layer Thickness µm | Evaluation result: Oblique light shielding performance: Maximum brightness direction polar angle/azimuthal angle | Evaluation result: Oblique light shielding performance: Oblique brightness/front brightness | Evaluation result: Moire Visibility |
|---|---|---|---|---|
| Example 11 | 106 | 30°/270° | 0.6% | Not visually recognized |
| Example 12 | 106 | 15°/270° | 1.4% | Not visually recognized |
| Comparative example 4 | — | 30°/270° | 6.2% | Not visually recognized |

EXPLANATION OF REFERENCES

10: first polarizer
11: absorption axis of first polarizer
20: second polarizer
21: absorption axis of second polarizer
30: retardation layer
31: slow axis of retardation layer
41, 42: slow axis of optically anisotropic layer
50: viewing angle control polarizing plate
60: light absorption anisotropic layer
61: normal direction of light absorption anisotropic film
62: section of light absorption anisotropic film collected by microtome
100: viewing angle control system of related art
410: optically anisotropic layer consisting of positive A-plate
411: optically anisotropic layer consisting of B-plate
412: optically anisotropic layer consisting of B-plate

What is claimed is:

1. A viewing angle control system comprising at least:

a first polarizer;

a retardation layer; and a second polarizer in this order, wherein an absorption axis of the first polarizer forms an angle of 45° or greater with respect to a top surface of the viewing angle control system, the retardation layer satisfies Expression (1) and Expression (2), and the second polarizer has an absorption axis in an in-plane direction, Expression (1): an in-plane retardation Re of the retardation layer satisfies an expression of 80 nm<Re<250 nm, and Expression (2): in a case of Nz=Rth/Re+0.5, an expression of 1.5<Nz<6 or −5<Nz <−0.5 is satisfied, where Rth represents a retardation of the retardation layer in a thickness direction.

2. The viewing angle control system according to claim 1, wherein the absorption axis of the first polarizer is perpendicular to the top surface of the viewing angle control system.

3. The viewing angle control system according to claim 1, wherein the retardation layer is a B-plate having an Nz coefficient of greater than 1.5, and an angle between a slow axis of the B-plate and the absorption axis of the second polarizer is 10° or less.

4. The viewing angle control system according to claim 1, wherein the retardation layer is a B-plate having an Nz coefficient of less than −0.5, and an angle between a slow axis of the B-plate and the absorption axis of the second polarizer is 80° or greater and 100° or less.

5. The viewing angle control system according to claim 1, wherein the retardation layer includes at least a positive A-plate and a positive C-plate, the positive A-plate is provided on a side of the first polarizer, and an angle between a slow axis of the positive A-plate and the absorption axis of the second polarizer is 80° or greater and 100° or less.

6. The viewing angle control system according to claim 1, wherein the retardation layer includes at least a negative A-plate and a negative C-plate, the negative A-plate is provided on a side of the first polarizer, and an angle between a slow axis of the negative A-plate and the absorption axis of the second polarizer is 10° or less.

7. The viewing angle control system according to claim 1, wherein the retardation layer includes at least a B-plate and a positive C-plate, the B-plate is provided on a side of the first polarizer, and an angle between a slow axis of the B-plate and the absorption axis of the second polarizer is 80° or greater and 100° or less.

8. The viewing angle control system according to claim 1, wherein the retardation layer includes at least a B-plate and a negative C-plate, the B-plate is provided on a side of the first polarizer, and an angle between a slow axis of the B-plate and the absorption axis of the second polarizer is 10° or less.

9. An image display device comprising:

the viewing angle control system according to claim 1.

10. The viewing angle control system according to claim 2, wherein the retardation layer is a B-plate having an Nz coefficient of greater than 1.5, and an angle between a slow axis of the B-plate and the absorption axis of the second polarizer is 10° or less.

11. The viewing angle control system according to claim 2, wherein the retardation layer is a B-plate having an Nz coefficient of less than −0.5, and an angle between a slow axis of the B-plate and the absorption axis of the second polarizer is 80° or greater and 100° or less.

12. The viewing angle control system according to claim 2, wherein the retardation layer includes at least a positive A-plate and a positive C-plate, the positive A-plate is provided on a side of the first polarizer, and an angle between a slow axis of the positive A-plate and the absorption axis of the second polarizer is 80° or greater and 100° or less.

13. The viewing angle control system according to claim 2, wherein the retardation layer includes at least a negative A-plate and a negative C-plate, the negative A-plate is provided on a side of the first polarizer, and an angle between a slow axis of the negative A-plate and the absorption axis of the second polarizer is 10° or less.

14. The viewing angle control system according to claim 2, wherein the retardation layer includes at least a B-plate and a positive C-plate, the B-plate is provided on a side of the first polarizer, and an angle between a slow axis of the B-plate and the absorption axis of the second polarizer is 80° or greater and 100° or less.

15. An image display device comprising:

the viewing angle control system according to claim 2.

16. An image display device comprising:

the viewing angle control system according to claim 3.

17. An image display device comprising:

the viewing angle control system according to claim 4.

18. An image display device comprising:

the viewing angle control system according to claim 5.

19. An image display device comprising:

the viewing angle control system according to claim 6.

20. An image display device comprising:

the viewing angle control system according to claim 7.

* * * * *